(12) United States Patent
Nagano et al.

(10) Patent No.: US 6,940,080 B2
(45) Date of Patent: Sep. 6, 2005

(54) CHARGED PARTICLE BEAM LITHOGRAPHY SYSTEM, LITHOGRAPHY METHOD USING CHARGED PARTICLE BEAM, METHOD OF CONTROLLING CHARGED PARTICLE BEAM, AND METHOD OF MANUFACTURING SEMICONDUCTOR DEVICE

(75) Inventors: Osamu Nagano, Kanagawa (JP); Susumu Hashimoto, Kanagawa (JP); Yuichiro Yamazaki, Tokyo (JP); Atsushi Ando, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/394,208

(22) Filed: Mar. 24, 2003

(65) Prior Publication Data

US 2004/0029046 A1 Feb. 12, 2004

(30) Foreign Application Priority Data

Mar. 28, 2002 (JP) ........................................ 2002-092570
Jan. 22, 2003 (JP) .......................................... 2003-13749

(51) Int. Cl.[7] .............................................. H01J 37/30
(52) U.S. Cl. .............................. 250/492.23; 250/492.22
(58) Field of Search ........................ 250/492.2, 492.23, 250/492.22, 398; 430/296

(56) References Cited

U.S. PATENT DOCUMENTS

| 4,075,488 A | * | 2/1978 | Okayama et al. | ........ 250/492.2 |
| 4,823,013 A | * | 4/1989 | van der Mast | ........... 250/492.2 |
| 5,932,884 A | * | 8/1999 | Aizaki | ................... 250/492.23 |

FOREIGN PATENT DOCUMENTS

| GB | 2 352 323 A | 1/2001 |
| JP | 05-234550 | 9/1993 |
| JP | 2000-173529 | 6/2000 |
| JP | 2001-093825 | 4/2001 |
| JP | 2002-050567 | 2/2002 |
| JP | 2002-093357 | 3/2002 |
| JP | 2002-216690 | 8/2002 |

OTHER PUBLICATIONS

Yamazaki, Y. et al., "Electron Optics Using Multipole Lenses for a Low Energy electron Beam Direct Wirirng System", J. Va. Sci. Technol. B, vol. 20, No. 1, pp. 25–30, (Jan/Feb. 2002).
Nagano, O. et al., Charged Particle Beam Exposure System, U.S. Appl. No. 09/920,633, filed Aug. 3, 2001.
Thomson, "The electrostatic moving objective lens and optimized deflection systems for microcolumns," J. Vac. Sci. Technol. B (Nov./Dec. 1996), 14:3802–07.
Sunaoshi et al., "Electron Beam Calibration Method for Character Projection Exposure System EX–BD," Jpn. J. Appl. Phys. (Dec. 1995), 34:6679–83.
Zach et al., "Aberration correction in a low voltage SEM by a multipole corrector," Nuclear Instruments and Methods in Physics Research (1995), 363:316–325.
Zach, "Design of a high–resolution low–voltage scanning electron microscope," Optik (1989), 83:30–40.

* cited by examiner

*Primary Examiner*—Jack I. Berman
(74) *Attorney, Agent, or Firm*—Finnegan, Henderson, Farabow, Garrett & Dunner, L.L.P.

(57) ABSTRACT

A charged particle beam lithography system includes a charged particle beam emitter which emits a charged particle beam to a wafer at an acceleration voltage lower than a voltage causing a proximity effect; an illumination optical system which adjusts a beam radius of the charged beam; a cell aperture having a cell pattern corresponding to a desired pattern to be written; a first deflector which deflects the charged particle beam with a first electric field to enter a desired cell pattern of the cell aperture; a demagnification projection optical system which demagnifies the charged particle beam form the cell aperture with a second electric field to form an image on the wafer; and a second deflector which deflects the charged particle beam from the cell aperture with a third electric field to adjust an irradiation position of the charged particle beam on the wafer.

40 Claims, 21 Drawing Sheets

CHARGED PARTICLE BEAM LITHOGRAPHY SYSTEM, LITHOGRAPHY METHOD USING CHARGED PARTICLE BEAM, METHOD OF CONTROLLING CHARGED PARTICLE BEAM, AND METHOD OF MANUFACTURING SEMICONDUCTOR DEVICE

CROSS REFERENCE TO RELATED APPLICATION

This application claims benefit of priority under 35USC §119 to Japanese patent applications No. 2002-92570, filed on Mar. 28, 2002 and No. 2003-13749, filed on Jan. 22, 2003, the contents of which are incorporated by reference herein.

BACKGROUND OF THE INVENTION

1. Field of the Invention

The present invention relates to a charged particle beam lithography system, a lithography method using a charged particle beam, a method of controlling a charged particle beam, and a method of manufacturing a semiconductor device.

2. Related Background Art

A charged particle beam lithography system has the function capable of forming a pattern of high resolution since it can write patterns with resolution of a wavelength level of an electron (ion) of which wavelength is shorter than light. On the other hand, different from a mask lithography method using light exposure, the charged particle beam lithography system directly form a complete pattern with small divided pattern beams, so that the apparatus has a drawback such that it takes long time for lithography.

The apparatus, however, has a feature that it can form a fine pattern of high precision and is developed as a technique following a lithography technique of light lithography method or an effective tool for manufacturing a semiconductor integrated circuit device for multi-product small-quantity production such as an ASIC (Application Specific Integrated Circuit). Examples of a method of forming a pattern directly with a charged particle beam such as an electron beam include a method of forming a pattern by scanning the whole face of a wafer while turning on or off a small circular spot beam and a VSB lithography method of forming a pattern with an electron beam which passes through a stencil aperture (for example, H. Sunaoshi et al, Jpn. J. Appl. Phys. Vol. 34 (1995), pp. 6679–6683, Part 1, No. 128, December 1995). As a lithography method obtained by further developing the VSB lithography method, an electron beam lithography technique of a one-shot exposure type of forming a pattern at high speed by preparing a stencil so that one block is constructed by repetitive patterns and performing selective exposure has been also developed.

An electron beam lithography system for the VSB lithography method disclosed by H. Sunaoshi et al. comprises an electron-optical system constructed by an electromagnetic lens and an electrostatic deflector. Consequently, the apparatus is required to comprise the configuration in full consideration of total optical characteristics of the lenses and deflector, mechanical assembly precision, influence of contamination and the like. To improve the beam resolution, a method of irradiating a resist on a wafer with highly accelerated electron beams is employed. It causes a proximity effect phenomenon such that back scattered electrons are generated in various multilayer thin films formed between the resist and the wafer by the irradiated electron beams and move upward in the resist. This proximity effect causes a blur in a pattern or deterioration in resolution. Therefore, a control for correcting the proximity effect is necessary and not only the electron optical system but also a large-scaled control system have to be constructed. As a result, the system becomes complicated, which might induce a further trouble, and a problem of deterioration in precision occurs. Since a highly-accelerated electron beam is used, damage on the surface of the wafer is also concerned.

To solve the problems of the VSB method using the highly-accelerated voltage charged particle beam, an electron beam lithography method of an aperture type using To solve the problems of the VSB method using the highly-accelerated voltage charged particle beam, an electron beam lithography method of an aperture type using a low-accelerated voltage electron beam has been proposed (for example, Japanese Patent Laid-open No. 2000-173529 and J. Vac. Sci. Technol. B14(6), 1996, 3802). An electron optical system of an electron beam lithography system disclosed in Japanese Patent Laid-open No. 2000-173529 uses an einzel lens for a demagnification projection optical system and, consequently, as shown in FIG. 1, an electron beam 67 draws trajectories which are rotation symmetric with respect to an optical axis. Consequently, the trajectory of the electron beam 67 is deflected with the same deflection sensitivity by a pre-main deflector 95', a main deflector 95, a pre sub-deflector 93', and a sub-deflector 93. A deflection aberration occurs also rotation symmetrically with respect to the optical axis.

However, in a demagnification projection optical system of the electron beam lithography system disclosed in Japanese Patent Laid-open No. 2000-173529, crossovers 98 and 99 of high current density are formed below a cell aperture 19. In the projection optical system, rotation-symmetrical electrostatic lenses (einzel lenses) 64 and 66 are employed in a deceleration-type focus mode, so that the electron beam 67 is decelerated in the lenses. Due to the two phenomena, the electron beam lithography system disclosed in Japanese Patent Laid-open No. 2000-173529 has problems in that a beam blur due to chromatic aberration and space-charge effect (particularly, Boersch effect) occurs, a cell aperture image is blurred on a wafer 14 and, as a result, a lithography characteristic degrades.

To solve the problems in the charged particle beam lithography method of an aperture type using a charged particle beam of a low-accelerated voltage, a lithography method in which a demagnification projection optical system is constructed with multi-fold multipole lenses has been proposed (Japanese Patent Laid-open Nos. 2001-93825, 2002-50567, 2002-93357, and 2002-216690). FIG. 2 shows an electron beam lithography system disclosed in Japanese Patent Laid-open No. 2002-50567. In the charged particle beam lithography system 100 shown in FIG. 2, a demagnification projection optical system in an electron optical system is constructed with fourfold multipole lenses. When an electron beam is used as a charged particle beam, an electron beam 8 accelerated from an electron gun 11 falls on a first aperture 13 having a rectangular or circular shape. The electron beam 8 passes through the first aperture 13 and travels toward the cell aperture 19 in which a plurality of one-shot exposure cell patterns are arranged. The electron beam 8 is shaped by an illumination lens 15 so as to have a beam radius which is sufficiently large for an arbitrary cell pattern and does not interfere with adjacent cell patterns.

The illumination lens 15 is constructed by two electrostatic lenses 15a and 15b (einzel lenses) and used by applying a negative voltage to a center electrode. The electron beam 8 from the second illumination lens 15b is deflected by a first shaping deflector 17 so that a target cell pattern in the cell aperture 19 is selected. After the electron beam 8 passes through the cell aperture 19, a cell aperture image is deflected back to the optical axis by a second shaping deflector 21. The electron beam 8 which has passed through the first shaping deflector 17 and cell aperture 19 starts as a cell pattern beam from the cell aperture 19 as a starting point and enters a multipole lens 23 in a state where the electron beam 8 is deflected back to the optical axis by the second shaping deflector 21. The multipole lens 23 is constructed with fourfold electrostatic lenses Q1 through Q4 to generate quadrupole fields (multipole lens fields) by using an octopole electrode.

It is assumed that the optical axis is a Z axis, two planes which are orthogonal to each other on the Z axis are an X plane and a Y plane, the trajectory of an electron beam on the X plane is an X trajectory, and the trajectory of an electron beam on the Y plane is a Y trajectory. A voltage is applied to the fourfold lenses Q1 through Q4 of the multipole lens 23 so that electric fields in two directions of the X and Y directions become a divergence electric field, a divergence electric field, a convergence electric field, and a divergence electric field in the X direction and a convergence electric field, a convergence electric field, a divergence electric field, and a convergence electric field in the Y direction, respectively. Shield electrodes 36 or 39 as ground electrodes are disposed in the vicinities of both sides of the multipole lens 23, first shaping deflector 17, second shaping deflector 21 and pre-main deflectors 25a and 25b in the optical axis direction. The shield electrode 36 between the first lens and second lens of the multipole lens 23 and the shield electrode 39 just above the pre-main deflector 25 serve as apertures 38 and 41, respectively. By detecting a beam current in the apertures 38 and 41, beam alignment between the illumination lens 15, first shaping deflector 17, second shaping deflector 21 and the lenses Q1 and Q2 of the multipole lens 23 is performed. FIG. 3 shows the trajectories of the electron beam 8 from the cell aperture 19 to the wafer 14. The electron beams 8 passes through the trajectories 8X and 8Y which are different from each other in the X and Y directions by the influences of each of the electric fields generated by the lenses Q1 through Q4 of the multipole lens 23 and are converged on the wafer 14 without forming a region of high electron density. With respect to the wafer 14 mounted on the XY stage, the location of a main field is controlled under a main deflection control carried out by superimposing deflected electric fields on the electric fields generated by pre-main deflector 25a and the multipole lenses 23 Q3 and Q4 so as to serve as deflectors, and the location of a sub field is controlled with a sub deflector 31 while referring to the position of an XY stage (not shown). A deflection aberration which occurs on the wafer 14 is controlled so as to be minimized by adjusting the deflection voltage ratio in the main deflection control under which the multipole lenses 23 Q3 and Q4 are controlled as deflectors by superimposing deflected electric fields on the electric field generated by the pre-main deflector 25 between the multipole lens 23 Q2 and Q3 and the electric fields generated by the multipole lens 23 Q3 and Q4. The inner radius of each of the multipole lenses 23 Q3 and Q4 on which the deflected electric fields are superimposed is designed to be larger than that of the quadruple lenses Q1 and Q2 (refer to FIG. 2). By the designing, the deflection aberration can be reduced. For example, as shown in FIG. 4, the deflection aberration is minimized through adjustment of the deflection voltage ratio by deflecting the electron beam in the X direction with the pre-main deflector 25a, main deflector 23 (Q3, 27) and sub deflector 31 (a trajectory 48X of the deflected beam in the X direction) and by deflecting the electron beam in the Y direction only with the main deflector 23 (Q3, 27) and the sub deflector 31 (a trajectory 48Y of the deflected beam in the Y direction).

However, in an optical system using the multipole lens 23 for a demagnification projection, the electron beam 8 passes through the trajectories which are largely asymmetric with respect to the optical axis, and the aberration characteristic in the X direction and that in the Y direction are largely different from each other. As a result, a cell aperture image is terribly blurred asymmetrically on the wafer 14.

On the other hand, when a multipole lens is applied to an electron optical lens and the trajectories which are largely asymmetric with respect to the optical axis are formed so as not to form a region 99 of high electron density in order to reduce a space-charge effect, a problem in that the lithography characteristic degrades occurs.

Hitherto, a method of correcting spherical aberration and chromatic aberration is use in which an einzel lens is employed for an optical system of an electron microscope for the like and a multipole lens is incorporated as a aberration corrector in a part of the optical system (for example, Japanese Patent Laid-open No. 5-234550, J. Zach and M. Haider, "Aberration correction in a low-voltage scanning microscope", Nuclear Instruments and Methods in Physics Research (Section A), Vol. 363, No. 1, 2, pp. 316–325, 1995, and J. Zach, "Design of a high-resolution low-voltage SEM by a multipole corrector". Optik 83, No. 1, pp. 30–40, 1989).

However, in the case of correcting the spherical aberration and chromatic aberration by an optical system constructed by an einzel lens, an aberration corrector has to be assembled separately from an image forming optical system. The method has a drawback such that, as a result, the optical length becomes longer and a blur due to the space-charge effect is worsened.

BRIEF SUMMARY OF THE INVENTION

According to a first aspect of the present invention, there is provided a charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with an electric field so as to enter a desired cell pattern of the cell aperture, and which deflect the charged particle beam which passes through the cell pattern back to an optical axis thereof;

a demagnification projection optical system which demagnifies the charged particle beam from the cell aperture with an electric field so as to form an image on the wafer;

an illumination position adjusting unit which adjusts an illumination position of the charged particle beam so that the charged particle beam entering the demagnification projection optical system passes through a trajectory substantially symmetrical with respect to the optical axis in one of two planes which intersect at right angle on the optical axis; and a second deflector which deflects the charged particle beam from the cell aperture with an electric field and which scans the wafer with the charged particle beam.

According to a second aspect of the present invention, there is provided a charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with an electric field so as to enter a desired cell pattern of the cell aperture, and which deflects the charged particle beam which passes through the cell pattern back to an optical axis thereof;

a demagnification projection optical system which demagnifies the charged particle beam from the cell aperture with an electric field so as to form an image on the wafer; and a second deflector which deflects the charged particle beam passed through the cell aperture by an electric field and making the charged particle beam scan the wafer, wherein the demagnification projection optical system controls magnification of the charged particle beam in a first direction orthogonal to the optical axis and magnification of the charged particle beam in a second direction orthogonal to the first direction and the optical axis independently of each direction so that aberration of the charged particle beam in the first direction and aberration of the charged particle beam in the second direction become substantially the same on the wafer, and the cell aperture is previously formed so that the cell pattern has a shape corresponding to difference between the magnification of the charged particle beam in the first direction and the magnification of the charged particle beam in the second direction due to control of the demagnification projection optical system.

According to a third aspect of the present invention, there is provided a charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with a first electric field so as to enter a desired cell pattern of the cell aperture, and which deflects the charged particle beam which passes through the cell pattern back to an optical axis thereof;

a demagnification projection optical system which demagnifies the charged particle beam from the cell aperture with a second electric field so as to form an image on the wafer; and a second deflector which deflects the charged particle beam from the cell aperture with a third electric field to adjust an irradiation position of the charged particle beam on the wafer, wherein the charged particle beam emitter emits the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam, and the demagnification projection optical system includes N-fold (N: a natural number of 2 or larger) of M-pole lenses (M: an even number of 4 or larger) and an aberration corrector which corrects at least one of spherical aberration and chromatic aberration in "M/2" directions each orthogonal to the optical axis independently of each other, the aberration occurring when the beam radius is increased by the irradiation optical system in order to reduce a blur caused by a space-charge effect in a position where the charged particle beam forms an image on the wafer.

According to a fourth aspect of the present invention, there is provided a lithography method using a charged particle beam comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer;

adjusting an illumination position of the charged particle beam so that the charged particle beam from the cell pattern passes through a trajectory which is substantially symmetrical with respect to the optical axis in one of two planes intersecting at a right angle on the optical axis; and a second deflection to deflect the charged particle beam of which illumination position is adjusted with an electric field to scan the wafer with the charged particle beam.

According to a fifth aspect of the present invention, there is provided a lithography method using a charged particle beam comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture by an electric field so as to form an image on the wafer; and a second deflection to deflect the charged particle beam from the cell aperture with an electric field and to scan the wafer with the charged particle beam, wherein the second deflection includes controlling deflection width of the charged particle beam in a first direction which is orthogonal to the optical axis and deflection width of the charged particle beam in a second direction which is orthogonal to the first direction and the optical axis independently of each other so that deflection aberration of the charged particle beam in the first direction and deflection aberration of the charged particle beam in the second direction become substantially the same on the wafer.

According to a sixth aspect of the present invention, there is provided a lithography method using a charged particle beam, comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer; and a second deflection to deflect the charged particle beam from the cell aperture with an electric field and to scan the wafer with the charged particle beam, wherein the demagnifying the charged particle beam includes controlling magnification of the charged particle beam in a first direction orthogonal to the optical axis and magnification of the charged particle beam in a second direction orthogonal to the first direction and the optical axis independently of each other so that aberration of the charged particle beam in the first direction and aberration of the charged particle beam in the second direction become substantially the same on the wafer.

According to a seventh aspect of the present invention, there is provided a charged particle beam controlling method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with a second electric field so as to form an image on the wafer; and a second deflection to deflect the charged particle beam from the cell aperture with a third electric field and to adjust the irradiation position on the wafer, wherein the second electric field includes N-folds (N: a natural number of 2 or larger) of M-pole (M: an even number of 4 or larger) electric fields generated by an M-pole lens, respectively, and the demagnification of the charged particle beam includes an aberration correction to correct at least one of spherical aberration and chromatic aberration in "M/2" directions each orthogonal to the optical axis independently of each other, the aberration occurring when the beam radius is increased in the beam radius adjustment in order to reduce a blur caused by a space-charge effect in a position where the charged particle beam forms an image on the wafer.

According to an eighth aspect of the present invention, there is provided a method of manufacturing a semiconductor device using a lithography method employing a charged particle beam, the lithography method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer;

adjusting an illumination position of the charged particle beam so that the charged particle beam from the cell pattern passes through a trajectory which is substantially symmetrical with respect to the optical axis in one of two planes intersecting at a right angle on the optical axis; and a second deflection to deflect the charged particle beam of which illumination position is adjusted with an electric field to scan the wafer with the charged particle beam.

According to a ninth aspect of the present invention, there is provided a method of manufacturing a semiconductor device using a lithography method employing a charged particle beam, the lithography method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture by an electric field so as to form an image on the wafer; and a second deflection to deflect the charged particle beam from the cell aperture with an electric field and to scan the wafer with the charged particle beam, wherein the second deflection includes controlling deflection width of the charged particle beam in a first direction which is orthogonal to the optical axis and deflection width of the charged particle beam in a second direction which is orthogonal to the first direction and the optical axis independently of each other so that deflection aberration of the charged particle beam in the first direction and deflection aberration of the charged particle beam in the second direction become substantially the same on the wafer.

According to a tenth aspect of the present invention, there is provided a method of manufacturing a semiconductor device using a lithography method employing a charged particle beam, the lithography method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer; and a second deflection to deflect the charged particle beam from the cell aperture with an electric field and to scan the wafer with the charged particle beam, wherein the demagnifying the charged particle beam includes controlling magnification of the charged particle beam in a first direction orthogonal to the optical axis and magnification of the charged particle beam in a second direction orthogonal to the first direction and the optical axis independently of each other so that aberration of the charged particle beam in the first direction and aberration of the charged particle beam in the second direction become substantially the same on the wafer.

According to an eleventh aspect of the present invention, there is provided a method of manufacturing a semiconductor device using a lithography method employing a charged particle beam, the lithography method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with a second electric field so as to form an image on the wafer; and a second deflection to deflect the charged particle beam from the cell aperture with a third electric field and to adjust the irradiation position on the wafer, wherein the second electric field includes N-folds (N: a natural number of 2 or larger) of M-pole (M: an even number of 4 or larger) electric fields generated by an M-pole lens, respectively, and the demagnification of the charged particle beam includes an aberration correction to correct at least one of spherical aberration and chromatic aberration in "M/2" directions each orthogonal to the optical axis independently of each other, the aberration occurring when the beam radius is increased in the beam radius adjustment in order to reduce a blur caused by a space-charge effect in a position where the charged particle beam forms an image on the wafer.

DETAILED DESCRIPTION OF THE INVENTION

Figure 1:
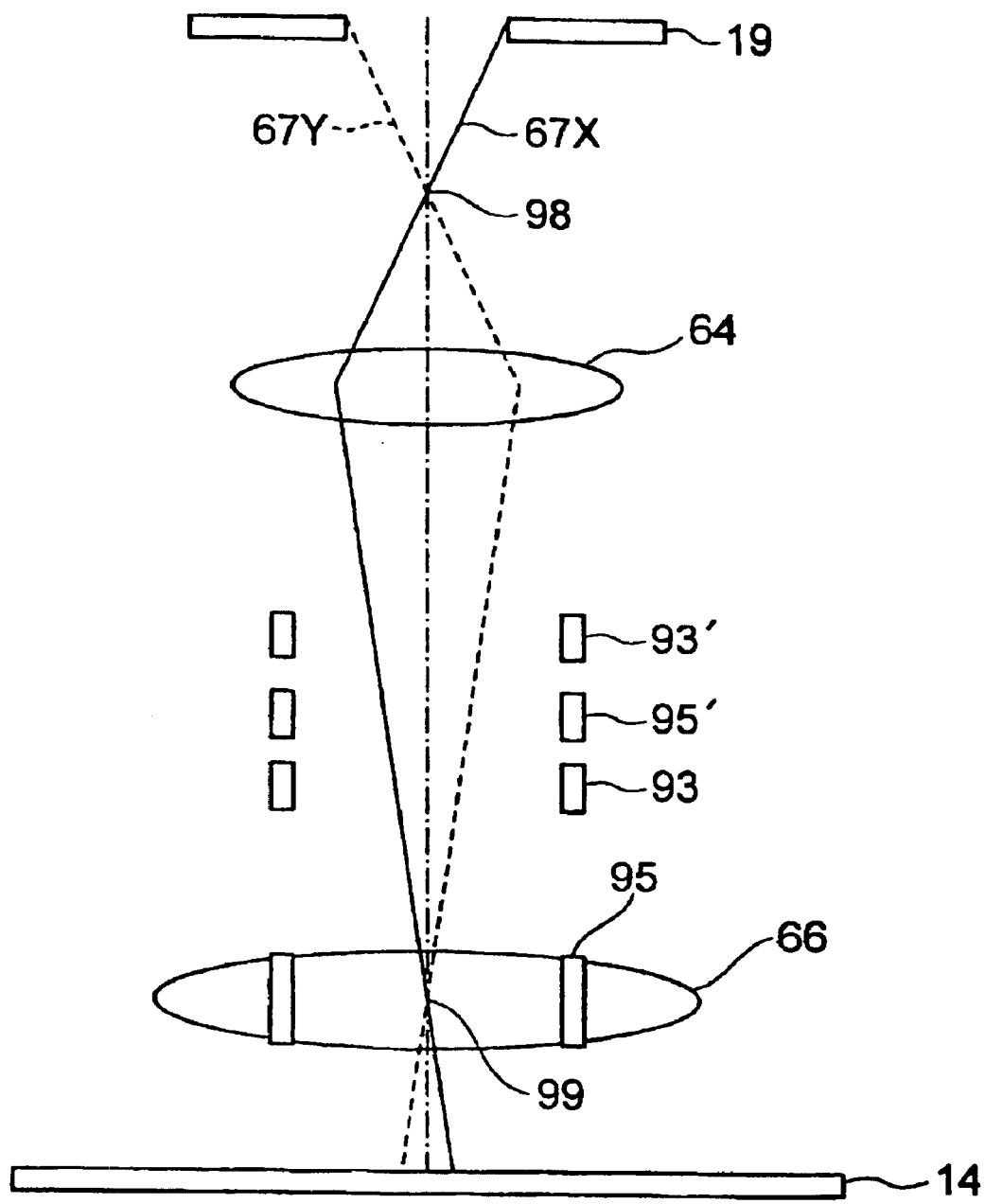
FIG. 1 is an explanatory diagram showing beam trajectories in an example of a demagnification projection optical system of a conventional electron beam lithography system.
Figure 2:
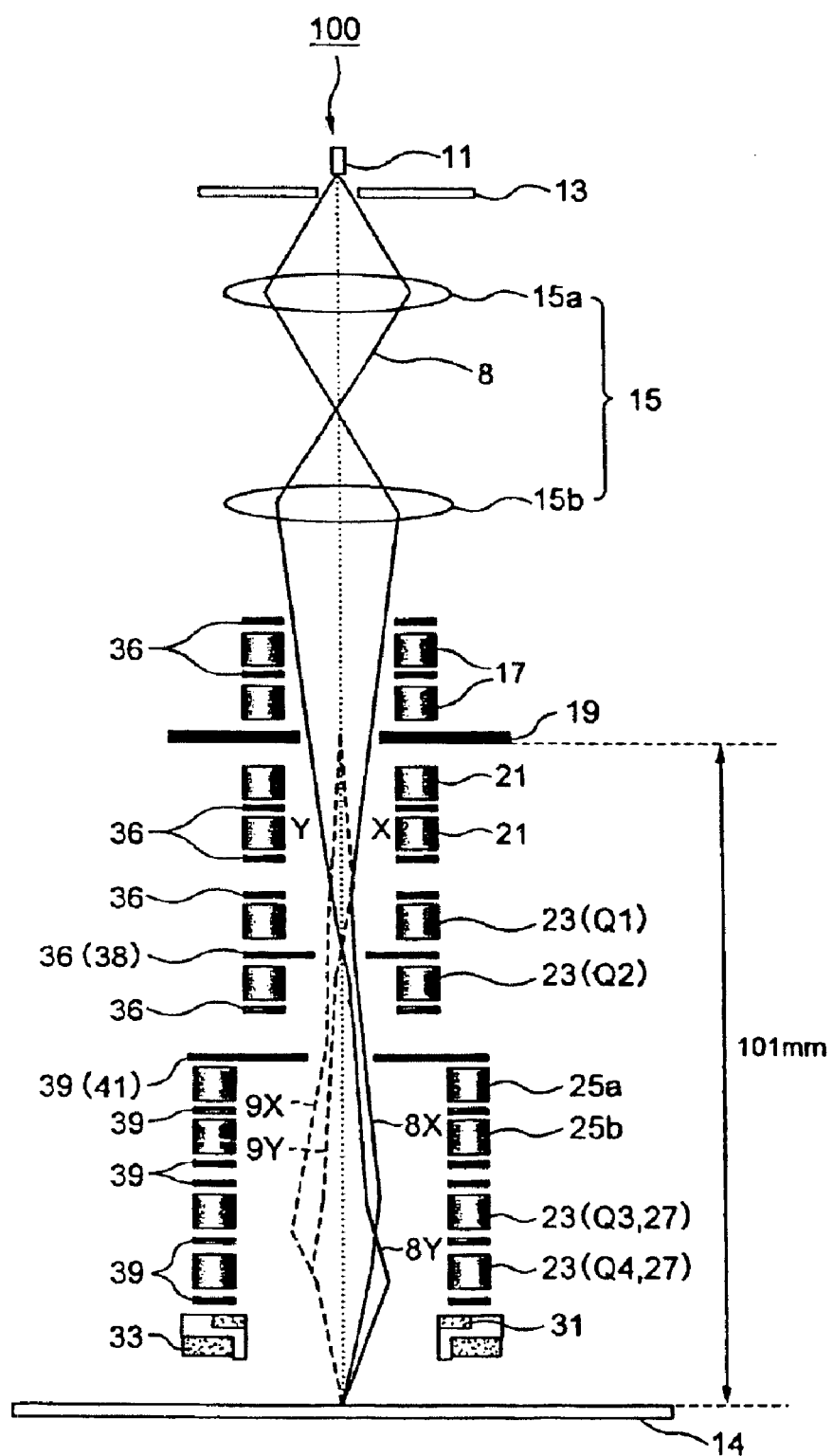
FIG. 2 is a schematic configuration diagram showing an example of a conventional electron beam lithography system of an aperture type using an electron beam of a low-accelerated voltage.

Embodiments of the invention will be described hereinbelow with reference to the attached drawings. In the drawings, the same components are designated by the same reference numerals and repetitive description will not be given. In the following embodiments, electron beam lithography which forms a pattern on a wafer with an electron beam will be described.

(1) First Embodiment

Figure 5:
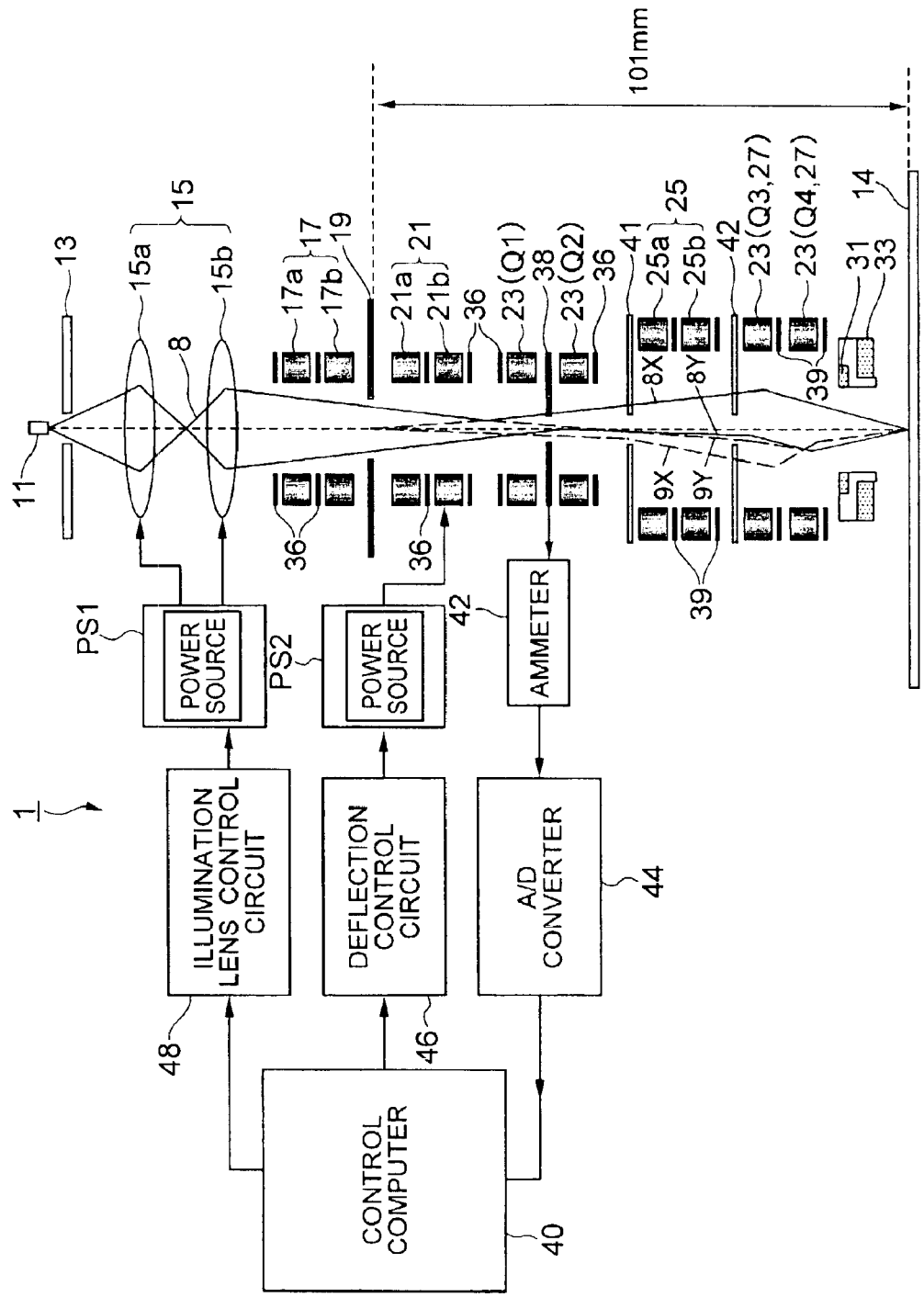
FIG. 5 is a schematic configuration diagram showing a main part of a charged particle beam lithography system according to a first embodiment of the invention.

FIG. 5 is a schematic configuration diagram showing a main part of a first embodiment of a charged particle beam lithography system according to the invention. An electron beam lithography system 1 shown in FIG. 5 comprises an electron optical system and an illumination position adjusting unit. The electron optical system includes an electron gun 11, a first aperture 13, illumination lenses 15 (15a, 15b), a first shaping deflectors 17 (17a, 17b), a cell aperture 19, a second shaping deflectors 21 (21a, 21b), fourfold of multipole lenses 23 (Q1 through Q4), pre-main deflectors 25 (25a, 25b), sub deflector 31, shield electrodes 36, 38, 39, 41 and 42, and a secondary electron detector 33. The illumination position adjusting unit includes a control computer 40, an ammeter 42, an A/D converter 44, a deflection control circuit 46, an illumination lens control circuit 48 and power sources PS1 and PS2.

Figure 6A:
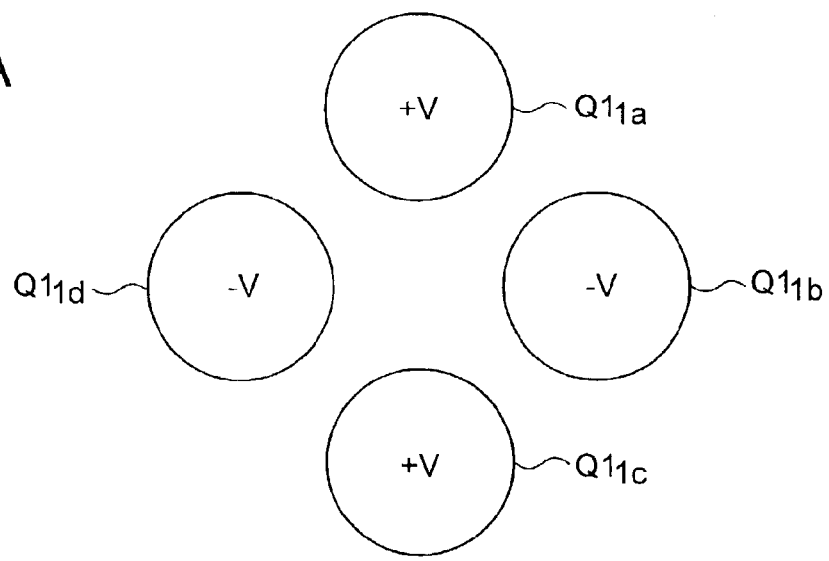
FIGS. 6A to 6C are plan views for explaining the electrode shape of a multipole lens comprised in the charged particle beam lithography system shown in FIG. 5.
Figure 6B:
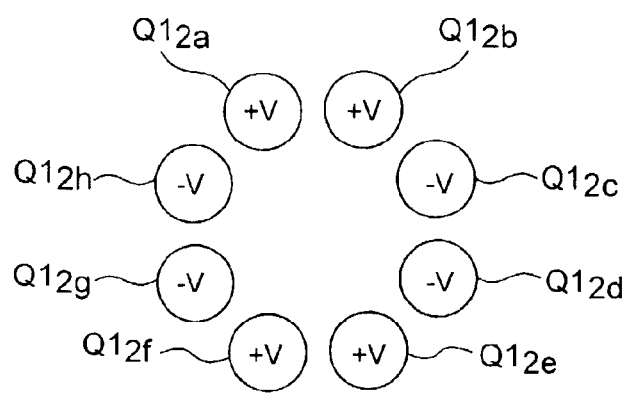
Figure 6C:
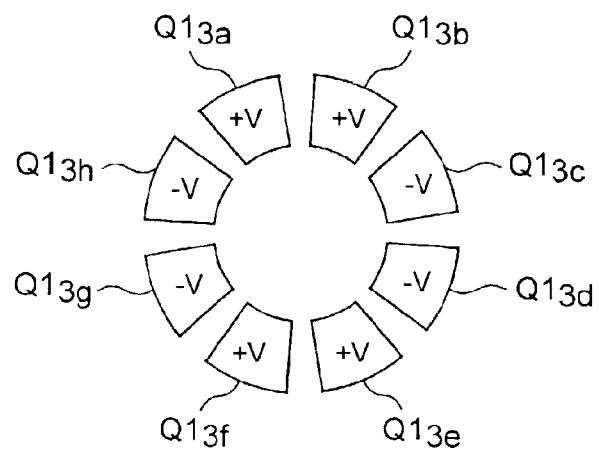

The electron gun 11 generates the low-accelerated electron beam 8 and emits the electron beam 8 toward the wafer 14. The electron beam 8 passes through the first aperture 13 having a rectangular or circular opening and travels toward the cell aperture 19 in which a plurality of cell patterns to be exposed in block are arranged. The illumination lens 15 is constructed by two electrostatic lenses (einzel lenses) and is used with a negative voltage being applied to the center electrode thereof. The illumination lens 15 shapes the electron beam 8 so as to have a beam radius which is large enough for an arbitrary cell pattern but which is small enough to avoid interfering adjacent cell patterns. The first shaping deflector 17 controls the target position of the electron beam 8 by deflecting the electron beam 8 so that a target cell pattern in the cell aperture 19 is selected by the electron beam 8 which passes through the second illumination lens 15b. The second shaping deflector 21 moves the cell aperture image passed through the cell aperture 19 back onto the optical axis. The electron beam 8 which has passed through the first shaping deflector 17 and cell aperture 19 starts as a cell pattern beam from the cell aperture 19 as a starting point and enters a multipole lens 23 in a state where it is deflected back to the optical axis by the second shaping deflector 21. The multipole lenses 23 (Q1 through Q4) are constructed by fourfolded electrostatic lenses Q1 through Q4 disposed so as to sandwich the pre-main deflectors 25a and 25b. Each multipole lens generates an electric field called a quadrupole field (multipole lens field) to control the electron beam 8 with the trajectory in the X direction and the Y direction which are different from each other. FIGS. 6A through 6C show specific shapes of the multipole lens 23.

FIG. 6A shows a quadrupole lens constructed by four electrodes. Electrodes $Q1_{1a}$ through $Q1_{1d}$ of the quadrupole lens shown in FIG. 6A, each having a cylindrical shape, are disposed at 90 degrees from each other. FIG. 6B shows an example of the configuration of an octapole lens having eight cylindrical electrodes $Q1_{2a}$ through $Q1_{2h}$ disposed at 45 degrees from each other. FIG. 6C shows another example of the configuration of an octapole having eight electrodes $Q1_{3a}$ through $Q1_{3h}$ each of a fan-shape in plan view, arranged at 45 degrees from each other.

In the cases shown in FIGS. 6B and 6C, the whole multipole lenses 23 function as a quadrupole lens by using two adjacent electrodes as one quadrupole electrode with respect to the eight electrodes. For example, a positive voltage (+V) is applied to the electrodes $Q1_{3a}$ and $Q1_{3b}$, thereby controlling the electrodes $Q1_{3a}$ and $Q1_{3b}$ to function as the electrode $Q1_{1a}$ shown in FIG. 6A.

Figure 3:
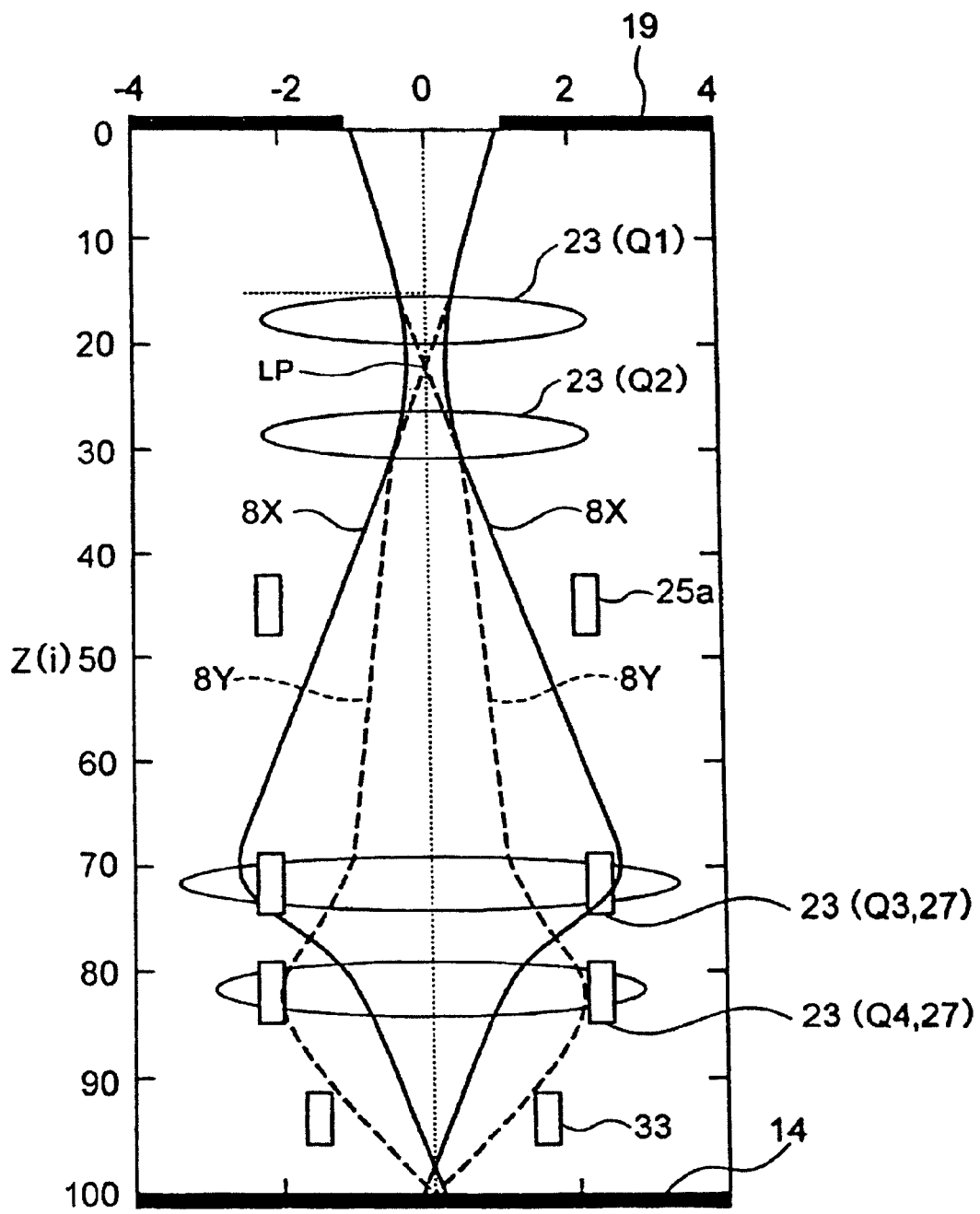
FIG. 3 is an explanatory diagram showing the trajectories of an electron beam in an electrostatic multipole lens optical system in the electron beam lithography system illustrated in FIG. 2.

It is assumed here that the optical axis is a Z axis, two planes which are orthogonal to each other on the Z axis are an X plane and a Y plane, the trajectory of an electron beam on the X plane is an X trajectory, and the trajectory of an electron beam on the Y plane is a Y trajectory. The electric fields in two directions of the X and Y directions generated by the fourfold multipole lenses are controlled so as to be a divergence electric field (Q1), a divergence electric field (Q2), a convergence electric field (Q3) and a divergence electric field (Q4) in the X direction, and a convergence electric field (Q1), a convergence electric field (Q2), a divergence electric field (Q3) and a convergence electric field (Q4) (refer to FIG. 3), in a sequential order from the first through fourth multipole lenses. In this embodiment, the multipole lenses 23 (Q1 through Q4) are controlled so that demagnification in the X direction and demagnification in the Y direction are different from each other. This point will be described in detail later.

Figure 4:
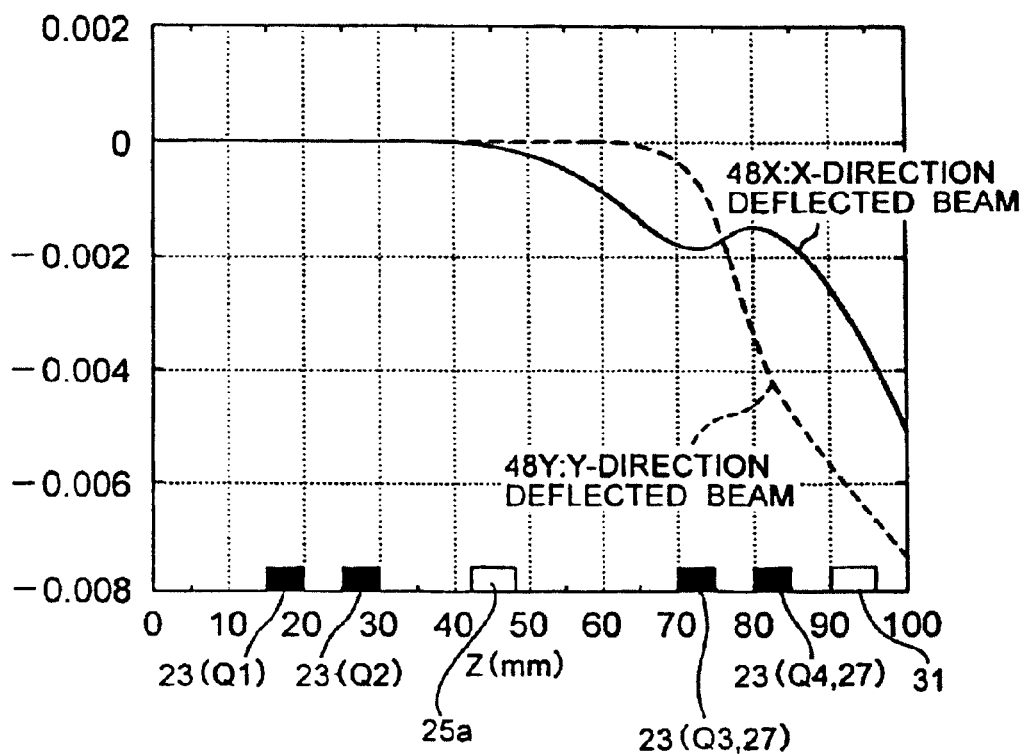
FIG. 4 is an explanatory diagram showing deflected trajectories of an electron beam in the electrostatic multipole lens optical system in the electron beam lithography system illustrated in FIG. 2.

Referring again to FIG. 5, the pre-main deflector 25 and the electrodes Q3 and Q4 of the multipole lenses 23 perform a main deflection control on the electron beam 8 by superimposing the deflection electric field on the above-mentioned divergence electric fields and convergence electric fields to control the trajectories of the electron beam, and control the position of the main field of the wafer 14 mounted on the XY stage through deflection of the electron beam 8 while referring to the position of the XY stage. The sub deflector 31 is disposed between the fourth electrode Q4 of the multipole lenses 23 and the wafer 14 to control the position of the electron beam 8 with respect to a sub field of the wafer 14. As shown in FIG. 4, deflection in the X direction is performed by using the pre-main deflector 25a, the main deflectors 23 (Q3, 27) (Q4, 27) and the sub deflector 31. Deflection in the Y direction is performed only by the main deflectors 23 (Q3, 27) (Q4, 27) and the sub deflector 31. As described above, by using different main deflectors in the X and Y directions and adjusting the deflection voltage ratio independently in each of the X and Y directions, the deflection aberration can be reduced. As shown in FIG. 5, the inner diameters of the multipole lens 23 Q3 and Q4 are designed to be larger than those of the multipole lens 23 Q1 and Q2. Thus, the deflection aberration can be further reduced.

In the electron beam lithography system 1 of the embodiment, the main deflectors and sub deflectors are controlled to deflect the electron beam 8 with different deflection widths in the X and Y directions. This point will be also described in detail later.

The secondary electron detector 33 is provided below the sub deflector 31 and detects secondary electrons, reflected electrons and back-scattered electrons which are generated when the wafer 14 is irradiated with the electron beam 8. The reflected electron signals are processed by a processor, thereby obtaining an SEM image which is used for controls such as beam adjustment.

The shield electrodes 36 are provided between the second shaping deflectors 21a and 21b, near the under face of the second shaping deflector 21b in the optical axis direction, the top face of the multipole lens 23 Q1 in the optical axis direction, and the under face of the multipole lens 23 Q2 in the optical axis direction. The shield electrode 38 is disposed between the multipole lens 23 Q1 and Q2. The shield electrodes 39 are disposed between the pre-main deflectors 25a and 25b, near the under face of the pre-main deflector 25b in the optical axis direction, between the multipole lens 23 Q3 and Q4, and the under face of the multipole lens 23 Q4 in the optical axis direction. The shield electrode 41 is disposed near the top face of the pre-main deflector 25a in the optical axis direction. The shield electrode 42 is disposed near the top face of the multipole lens 23 Q3 in the optical axis direction. All of the shield electrodes 36, 38, 39, 41 and 42 are grounded to prevent an electrostatic field excited by the electrodes from leaking out, thereby largely reducing the possibility that the electrostatic fields generated by the lenses and deflectors interfere with each other. The shield electrodes 38, 41 and 42 also serve as apertures. By using the apertures to detect a beam current, alignment of the electron beam 8 can be adjusted with respect to each of the illumination lens 15, the first shaping deflector 17, the second shaping deflector 21, the multipole lenses 23 Q1 and Q2, and pre-main deflector 25.

The illumination position adjusting unit of the electron beam lithography system 1 of the embodiment adjusts the illumination position of the electron beam 8 to the multipole lens 23 by using the shield electrode 38. The "illumination position" means a cross-over position on the optical axis when all of the multipole lenses are in off-state. The adjusting method will be described by referring to FIGS. 7, 8A, 8B, 9A and 9B.

Figure 7:
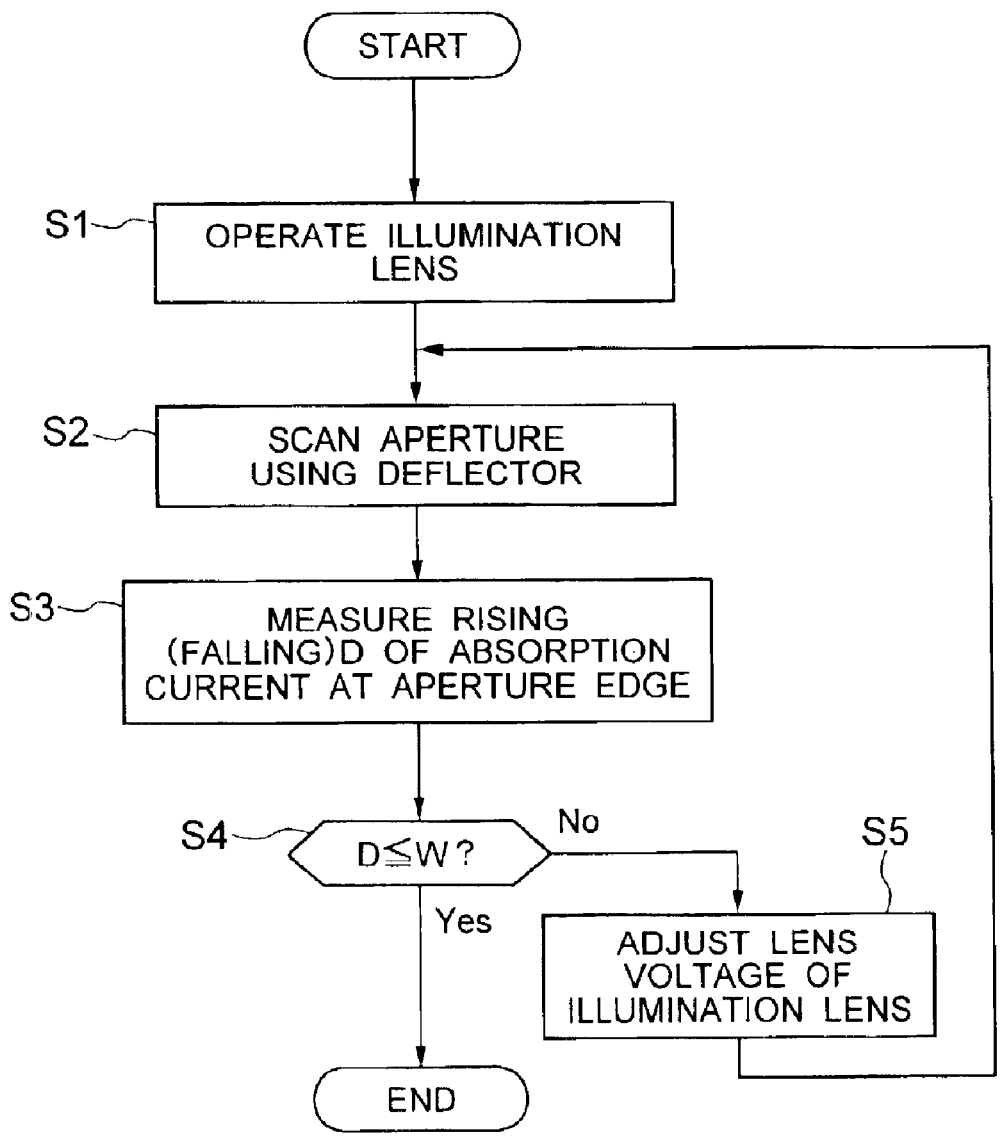
FIG. 7 is a flowchart showing a schematic procedure of a method of adjusting an illumination position of an electron beam.

FIG. 7 is a flowchart showing a schematic procedure of the method of adjusting the illumination position of the electron beam 8. First, the control computer 40 sets the multipole lens 23 to an off state and supplies a control signal to the illumination lens control circuit 48 to apply a negative voltage from the power source PS1 to the illumination lens 15, thereby emitting the electron beam 8 to the aperture 38 (step S1). Subsequently, the control computer 40 supplies a control signal to the deflection control circuit 46 to apply a voltage from the power source PS2 to the second shaping deflector 21, thereby scanning the aperture 38 with the electron beam 8 as shown by the arrow in FIG. 8A (step S2). An absorption current I absorbed by the aperture 38 by irradiation with the electron beam 8 is measured by the ammeter 42, a result of measurement is converted to a digital signal by the A/D converter 44, and the digital signal is supplied to the control computer 40. The control computer 40 calculates the rising (falling) time D of the absorption current I at the aperture edge (step S3).

Figure 8A:
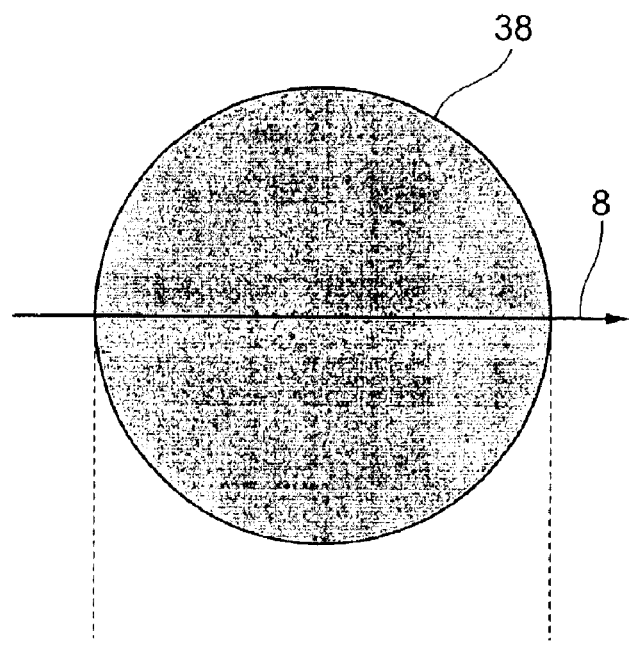
FIGS. 8A to 8C are explanatory diagrams of the adjusting method shown in FIG. 7.
Figure 8B:
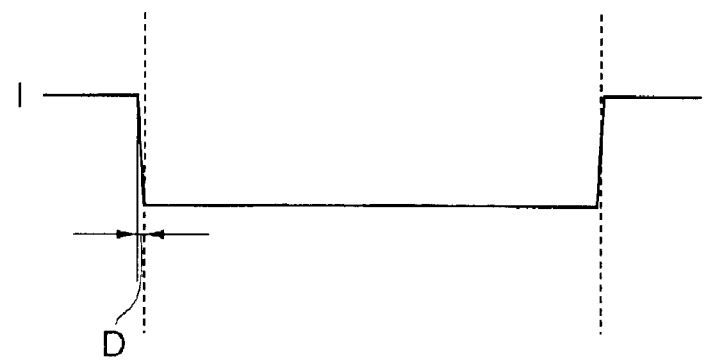
Figure 8C:
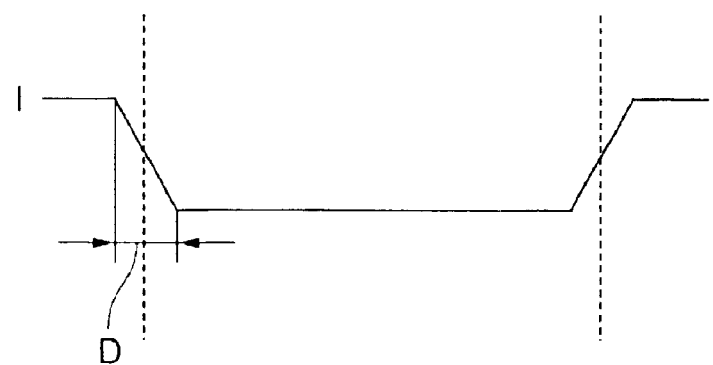
Figure 9A:
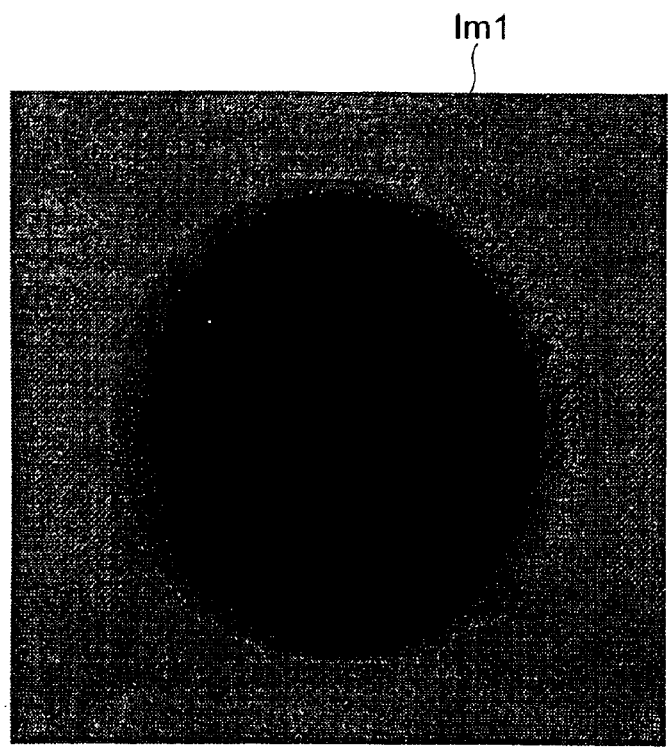
FIGS. 9A and 9B are explanatory diagrams of another method of adjusting an illumination position of an electron beam.
Figure 9B:
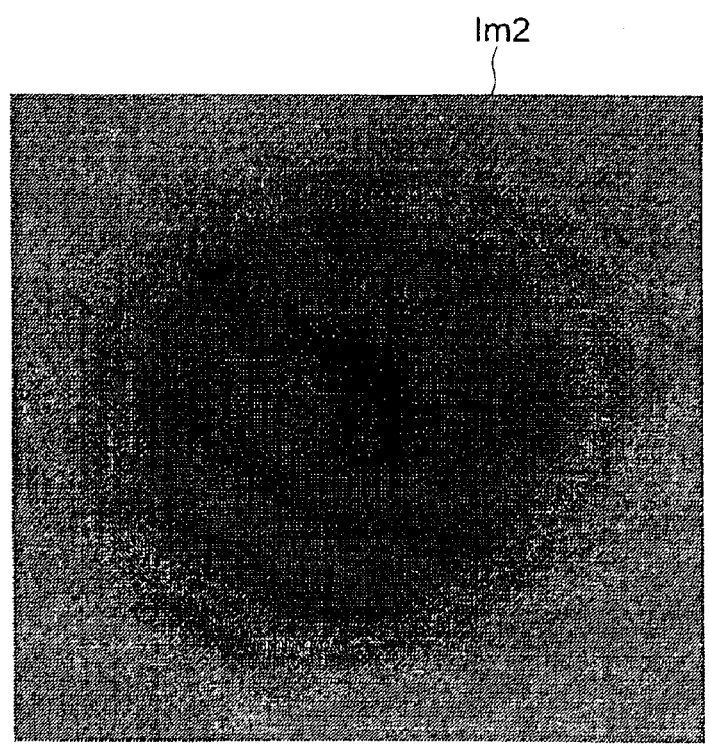

When the electron beam 8 is in an appropriate illumination position and its beam radius is sufficiently small, the absorption current I suddenly decreases (increases) by passage of the aperture edge of the electron beam 8. Therefore, as shown in FIG. 8B, the rising (falling) time D in the waveform of the absorption current I is short. On the other hand, when the electron beam 8 is not in an appropriate illumination position and its beam radius is large, the absorption current I decreases (increases) gently even after the electron beam 8 passes the aperture edge. Therefore, as shown in FIG. 8C, the rising (falling) time D in the waveform of the absorption current I becomes longer.

The control computer 40 compares the calculated rising (falling) time D with a predetermined threshold W (step S4). If the rising (falling) time D is equal to or shorter than the threshold W, it is determined that the illumination position of the electron beam 8 is appropriate. On the other hand, if the rising (falling) time D is longer than the threshold W, the control computer 40 determines that the illumination position of the electron beam 8 is inappropriate, adjusts a signal supplied to the illumination lens control circuit 48 to adjust the lens voltage of the illumination lens 15 (step S5), and repeats the steps S2 through S4 until the rising (falling) time D becomes equal to or shorter than the threshold W.

In the above-mentioned illumination position adjusting method, the beam radius of the electron beam 8 is adjusted by using the threshold W. The invention is not limited to the method. For example, the beam radius may be adjusted until a sectional shape of a circle of least confusion is obtained. In the electron beam lithography system 1 of the embodiment, the illumination position of the electron beam 8 is automatically adjusted by the illumination position adjusting unit. Even in the case where such an illumination position adjusting unit is not provided, the illumination position of the electron beam 8 can also be detected by visually monitoring an absorption current of the aperture 38 with a display (not shown). When the beam radius of the electron beam 8 is sufficiently small during scanning of the aperture 38, the opening of the aperture can be clearly recognized, for example, as shown in an image Im1 of FIG. 9A. On the other hand, when the beam radius of the electron beam 8 is large during scanning of the aperture 38, the edge of the aperture is very unclear, for example, as shown in an image Im2 of FIG. 9B. Therefore, by adjusting the voltage of the illumination lens 15 by an operator until an image showing a clear edge of the aperture 38 is obtained, the illumination position of the electron beam 8 can also be adjusted.

Figure 10A:
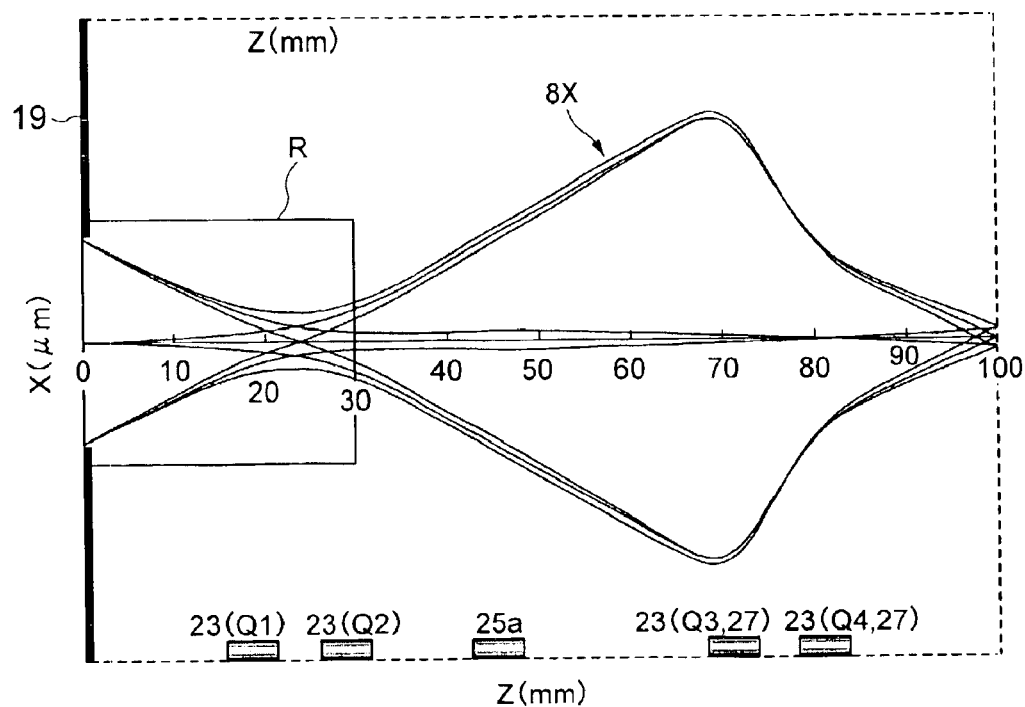
FIG. 10A is a diagram showing the trajectories of an electron beam in the X direction when an appropriate illumination position is obtained and FIG. 10B is a partial enlarged view of FIG. 10A.
Figure 10B:
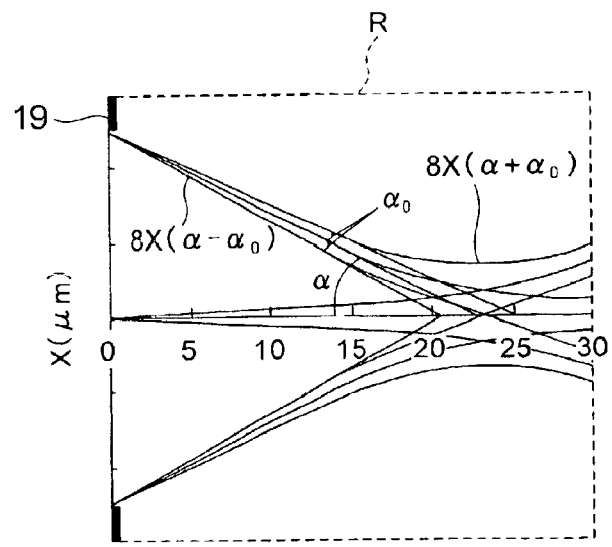
Figure 11:
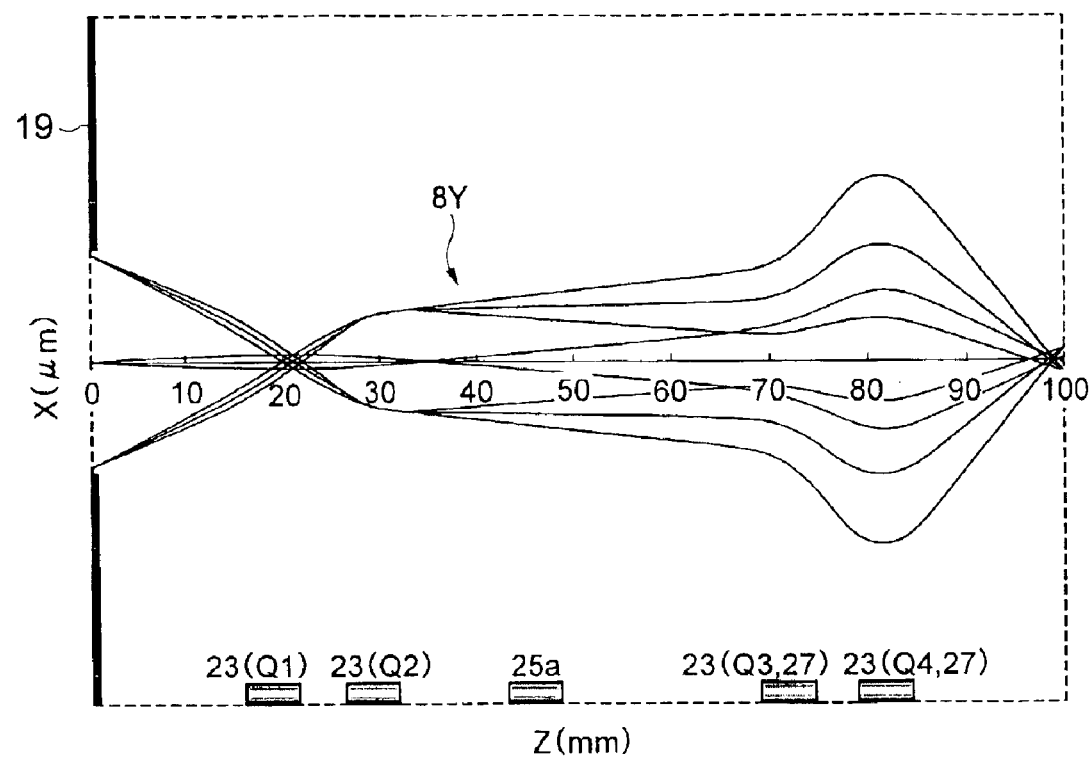
FIG. 11 is a diagram showing the trajectories of an electron beam in the Y direction when an appropriate illumination position is obtained.

FIGS. 10A and 10B and FIG. 11 show trajectories of the electron beam 8 in a range from the cell aperture 19 to the wafer 14 when an appropriate illumination position is obtained. FIG. 10A shows the trajectories of the electron beam 8 in the X direction. FIG. 11 shows the trajectories in the Y direction at that time. FIG. 10B is an enlarged view of the region indicated by a reference character R in FIG. 10A. As obviously understood from comparison between FIGS. 10A and 11, by the operation of the multipole lens 23 (Q1 through Q4), the electron beam 8 passes through the different trajectories in the X and Y directions and is converged on the wafer 14 without forming a region of high electron density. The illumination position of the electron beam 8 is in a region of the downstream side of the first multipole lens 23 Q1 in the demagnification projection optical system including the region of the first multipole lens 23 Q1 itself. Thus the trajectory causing no region of high electron density can be formed also in the region including an illumination position of the electron beam 8, so that the space-charge effect can be further reduced.

According to the illumination position adjusting unit of the electron beam lithography system 1 of the embodiment, when the electron beam 8 in the X direction, in which the aberration characteristic is inferior, is emitted at a divergence angle $\alpha_0$ as shown in FIG. 10B from an arbitrary position on the cell aperture 19, an $8X(\alpha+\alpha_0)$ trajectory (the angle of which from the optical axis (Z axis) is $\alpha+\alpha_0$) and an $8X(\alpha-\alpha_0)$ trajectory (the angle of which from the optical axis is $\alpha-\alpha_0$) become symmetrical with respect to the optical axis. The aberration characteristic of the electron beam 8 in the X direction can thus be improved.

In the deflection control on the electron beam 8 deflection sensitivity and deflection aberration characteristics in the X direction and those in the Y direction are largely different from each other since the electron beam lithography system 1 of the embodiment uses the demagnification projection optical system which forms different trajectories in the X and Y directions. Specifically, as shown in FIG. 10A, the electron beam 8 in the X direction is subjected to the divergent electric field just before the wafer 14, so that the deflection aberration characteristic in the X direction deteriorates. By decreasing the deflection voltage in each of the main deflection region and the sub deflection region in the X direction of much deflection aberration and increasing the deflection voltage in the Y direction, the deflection aberration characteristic in the X direction and that in the Y direction can be made generally the same. More specifically, the ratio (deflection voltage ratio) between the deflection voltage in the X direction to be applied to the pre-main deflector 25a, main deflectors 23 (Q3, 27) (Q4, 27) and sub deflector 31, and the deflection voltage in the Y direction to be applied to main deflectors 23 (Q3, 27) (Q4, 27) and the sub deflector 31 is adjusted so that the deflection width in the X direction becomes smaller than that in the Y direction. A specific adjustment amount of the deflection width is obtained by calculating each of aberration in the X direction and aberration in the Y direction which occur when the beam is deflected with the same width in the X and Y directions by simulation or the like and by calculating the ratio so that the aberration in the X direction becomes equal to the aberration in the Y direction using the calculation result of the aberration in the X direction and in the Y direction.

Figure 12:
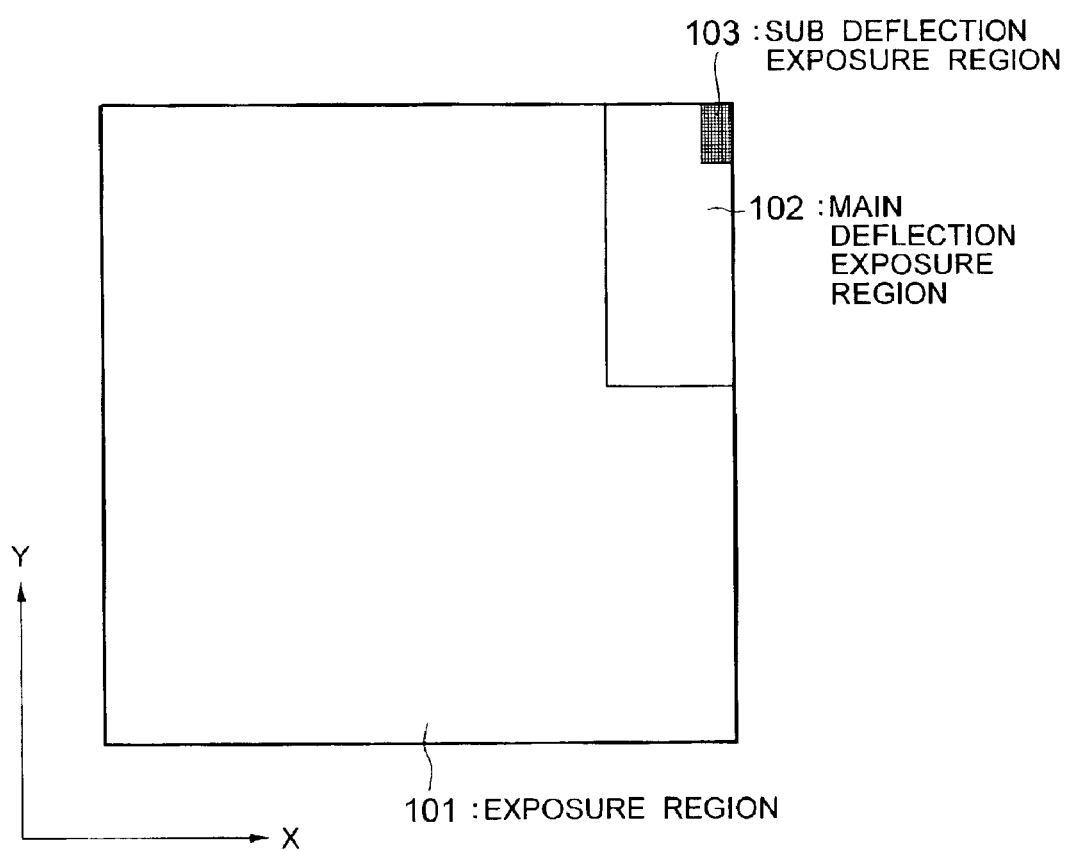
FIG. 12 is a schematic diagram for explaining an exposure region according to a deflection control method using the electron beam lithography system shown in FIG. 5.

FIG. 12 is a schematic diagram for explaining an exposure region by a deflection control method using the electron beam lithography system 1 of the embodiment. As shown in FIG. 12, for example, when the whole exposure region is a square exposure region 101, deflection control is performed so that the deflection width in the X direction becomes smaller than the deflection width in the Y direction. Consequently, each of a main deflection exposure region 102 (main field) and a sub deflection exposure region 103 (sub field) becomes a rectangle of which longitudinal direction is the Y direction. However, the size itself of each of the main deflection exposure region 102 and the sub deflection exposure region 103 is the same as that of the conventional deflection region because the adjustment of the deflection width in each of the directions is relative adjustment in the X and Y directions. According to the, embodiment, the total aberration can thus be reduced without reducing the size of each of the deflection regions.

Generally, the smaller the magnification M ($M \leq 1$) of the demagnification projection optical system becomes, the more the aberration characteristic deteriorates. As described above, in the embodiment, the trajectory in the X direction and that in the Y direction are different from each other and the electron beam 8X in the X direction is subjected to the divergent electric field just before the wafer 14, so that the aberration characteristic in the X direction deteriorates. Consequently, a voltage applied to the multipole lenses 23 (Q1 through Q4) is adjusted so that the magnification in the X direction of the deteriorated aberration characteristic becomes relatively large and the magnification in the Y direction becomes relatively small. By the adjustment, the aberration characteristic can be improved while maintaining the magnification M to be small. A specific ratio of the magnification in the X direction and the magnification in the Y direction can be computed by, for example, a method similar to the above-described simulation of the deflection amount. In addition, a cell pattern on the cell aperture 19 is preliminarily produced in correspondence with such magnification adjustment so that the magnification in the X direction and that in the Y direction of the cell pattern are different from those of a desired pattern to be transferred onto the wafer 14.

As described above, according to the embodiment, the aberration characteristic can be further improved as well as the influence of the space-charge effect can be substantially reduced using a low-accelerated charged particle beam.

(2) Second Embodiment

Figure 13:
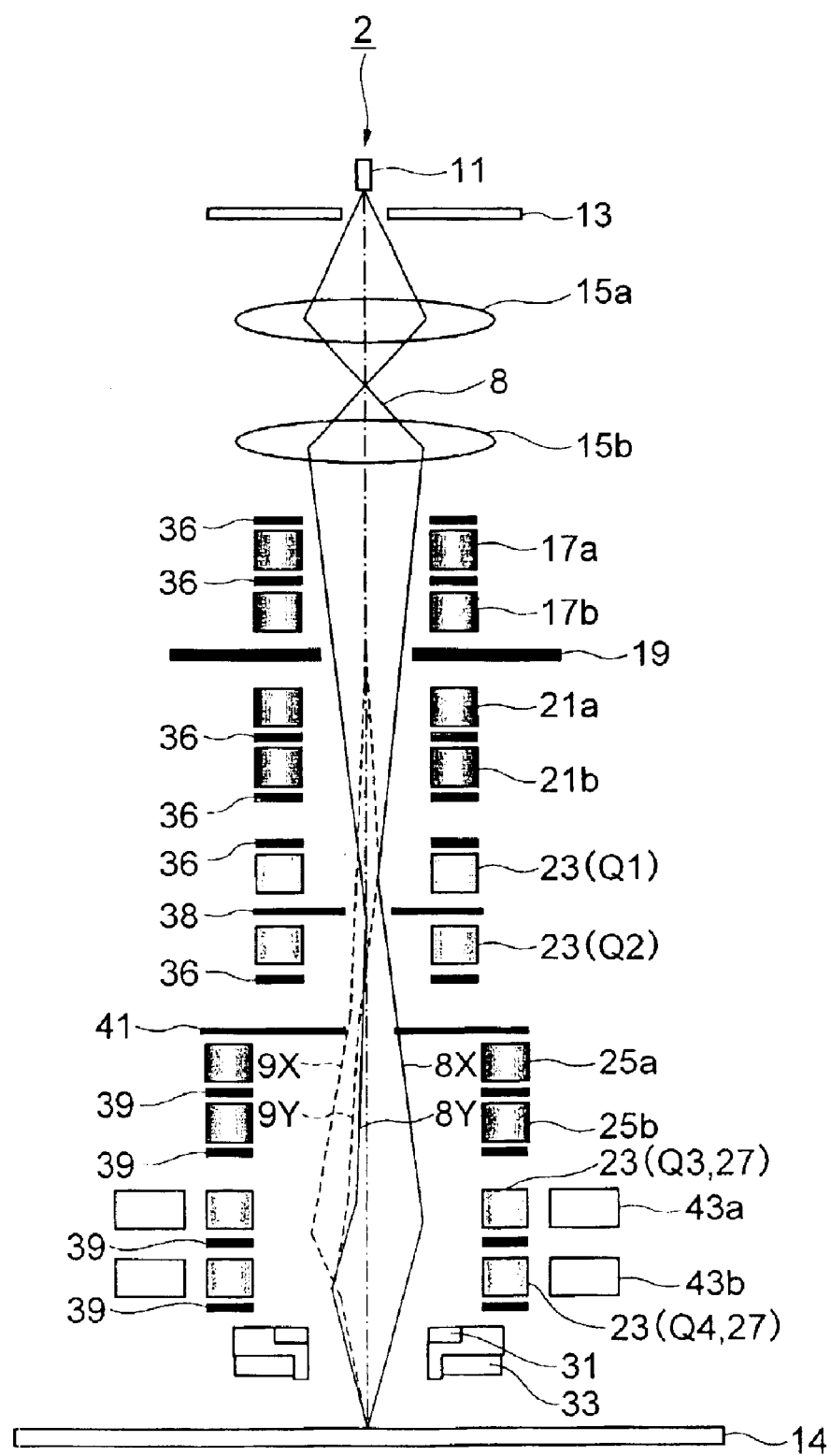
FIG. 13 is a schematic configuration diagram showing a main part of a charged particle beam lithography system according to a second embodiment of the invention.

A second embodiment of the invention will be described with reference to FIGS. 13 through 15. FIG. 13 is a schematic configuration diagram showing a main part of an electron beam lithography system according to this embodiment. An electron beam lithography system 2 shown in FIG. 13 is characterized in that it comprises magnetic field type quadrupole lenses 43a and 43b provided outside of the third and fourth electrostatic multipole lenses 23 (Q3 and Q4) and substantially at the same levels as the electrostatic multipole lenses 23 (Q3 and Q4) in the direction along the optical axis. The magnetic field type quadrupole lenses 43a and 43b excite magnetic quadrupole fields and superimpose the magnetic quadrupole fields on the quadrupole fields of the electric field type excited by the third and fourth multipole lenses 23 (Q3 and Q4), respectively. Consequently, the magnetic field type quadrupole lenses 43a and 43b correct chromatic aberration in a position where the chromatic aberration substantially occurs since the trajectory of the electron beam 8 is at furthest from the optical axis. The other configuration of the electron optical system of the electron beam lithography system 2 according to the second embodiment is substantially the same as that of the electron optical system of the electron beam lithography system 1 shown in FIG. 5.

Figure 14:
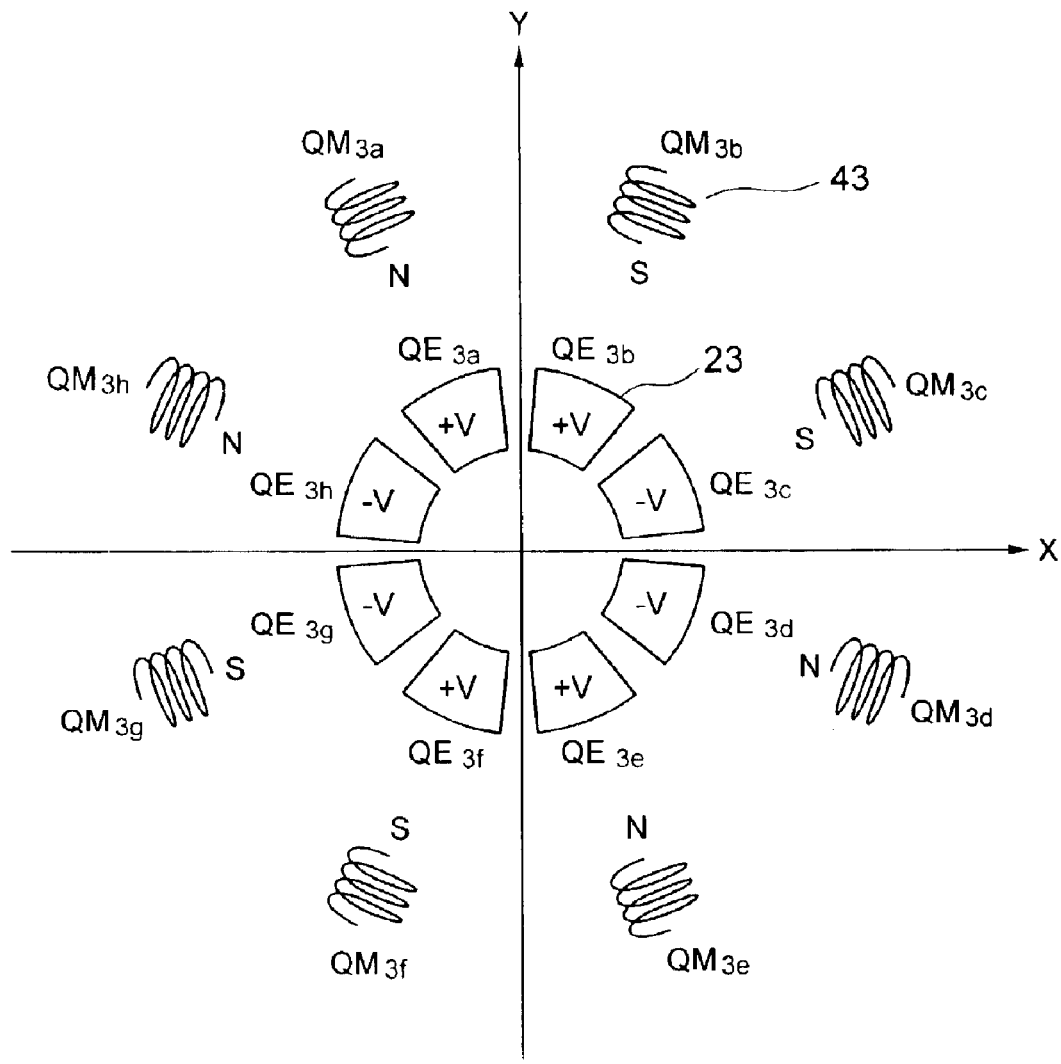
FIG. 14 is a plan view showing an example of a magnetic field type quadrupole lens comprised in the charged particle beam lithography system illustrated in FIG. 13.

FIG. 14 is a plan view showing an example of the magnetic field type quadrupole lenses 43a and 43b. In the example shown in the diagram, eight coils $QM_{3a}$ through $QM_{3h}$ are disposed outside of electrodes $QE_{3a}$ through $QE_{3h}$ of the quadrupole lens 23 radially around the optical axis as a center so that each of the coils corresponds to each of the electrodes $QE_{3a}$ through $QE_{3h}$, respectively. When a current is supplied to the coils $QM_{3a}$ through $QM_{3h}$, the magnetic quadrupole field is excited and superimposed on the electric field type quadrupole field excited by the electrodes $QE_{3a}$ through $QE_{3h}$ of the multipole lens 23.

Figure 15:
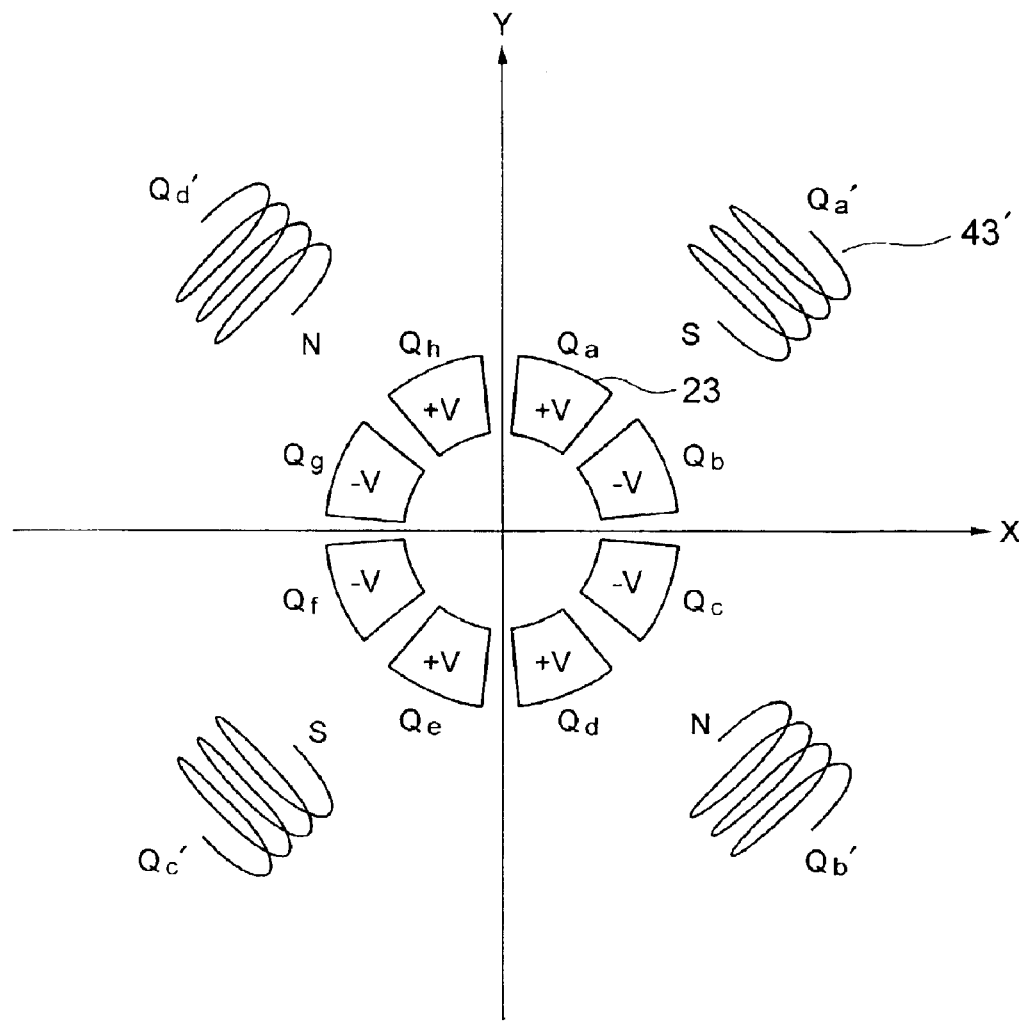
FIG. 15 is a plan view showing another example of the magnetic field type quadrupole lens comprised in the charged particle beam lithography system illustrated in FIG. 13.

FIG. 15 is a plan view showing another example of the magnetic field type quadrupole lens. A magnetic field type quadrupole lens 43' shown in the diagram is constructed by four coils Qa' through Qd' which are disposed outside of pairs of electrodes Qa and Qb, electrodes Qc and Qd, electrodes Qe and Qf and electrodes Qg and Qh of the quadrupole lens 23, respectively, at an angle of approximately 45° with the X and Y directions.

Referring again to FIG. 13, in the X direction, in the position of the third electrostatic quadrupole lens 23 (Q3) in which the electron beam 8 is most diverged (refer to FIG. 3), the magnetic field type quadrupole lens 43a excites the magnetic quadrupole fields and the magnetic quadrupole fields are superimposed on the electric quadrupole fields, thereby correcting chromatic aberration. In the Y direction, in the position of the fourth electrostatic quadrupole lens 23 (Q4) in which the electron beam 8 is most diverged (refer to FIG. 3), the magnetic field type quadrupole lens 43b excites the magnetic quadrupole fields and the magnetic quadrupole fields are superimposed on the electric quadrupole fields, thereby correcting chromatic aberration.

As described above, according to the second embodiment, chromatic aberration caused by divergence of the electron beam 8 in the demagnification projection optical system is corrected. Consequently, the illumination position LP of the electron beam 8 can be made closer to the wafer 14. Furthermore, the beam radius can be enlarged by increasing the aperture angle. The distance between individual electrons can be increased and a blur caused by the space-charge effect can be substantially reduced.

(3) Third Embodiment

A third embodiment of the invention will be described with reference to FIGS. 16 and 17.

Figure 16:
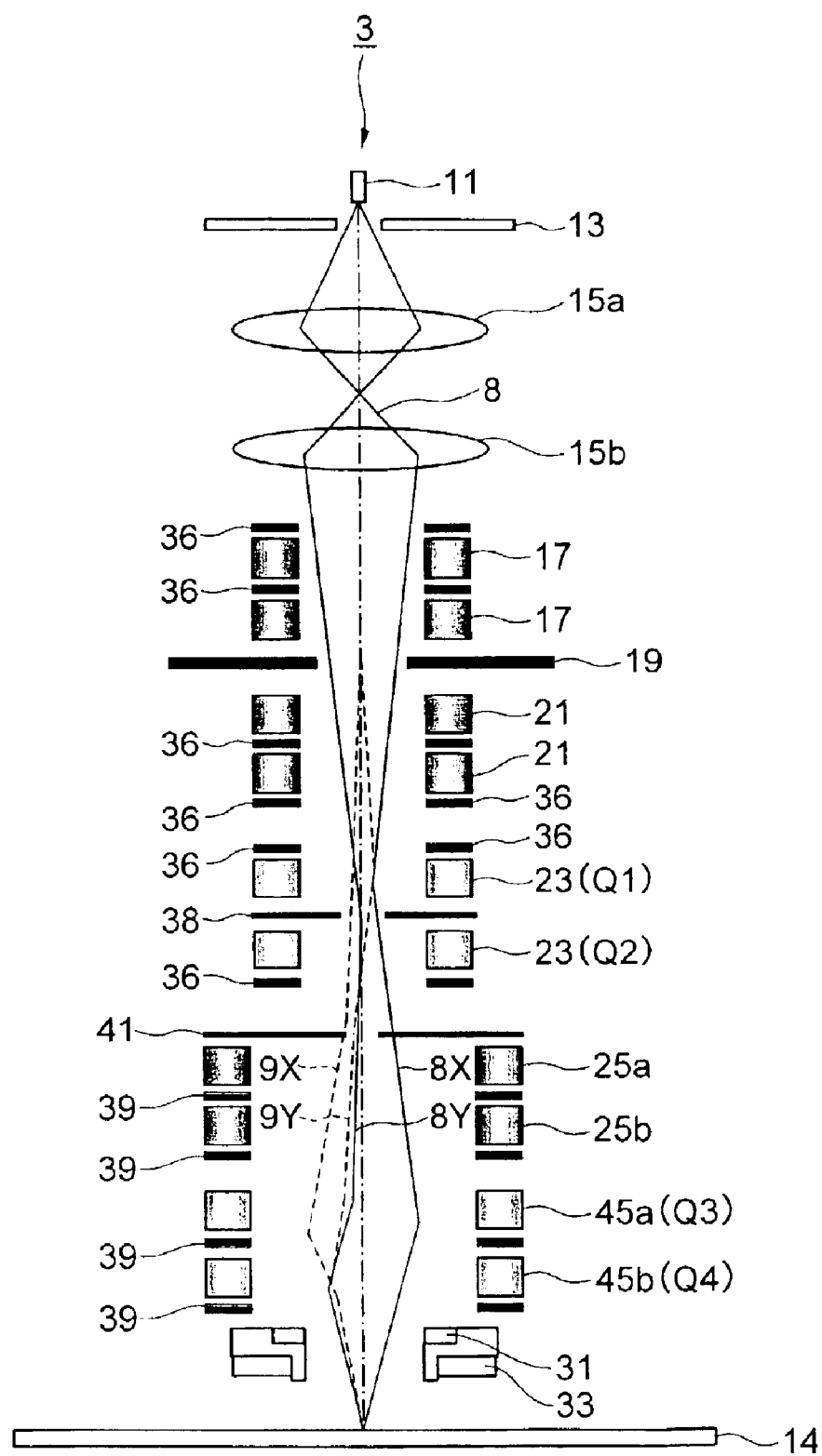
FIG. 16 is a schematic configuration diagram showing a main part of a charged particle beam lithography system according to a third embodiment of the invention.

FIG. 16 is a schematic configuration diagram showing a main part of an electron beam lithography system according to the third embodiment. As apparent from comparison with the electron beam lithography system 2 shown in FIG. 13, an electron beam lithography system 3 of the third embodiment is characterized in that quadrupole lenses 45 (45a and 45b) for electric and magnetic fields are provided in place of the multipole lenses 23 (Q3 and Q4) and the magnetic-field type octapole lenses 43a and 43b in FIG. 13, and an electric quadrupole field and a magnetic quadrupole field are simultaneously excited and superimposed by the quadrupole lenses 45 for the magnetic and electric fields. The other configuration and basic operation of the electron beam lithography system 3 are substantially the same as those of the electron beam lithography system 2 in FIG. 13.

Figure 17:
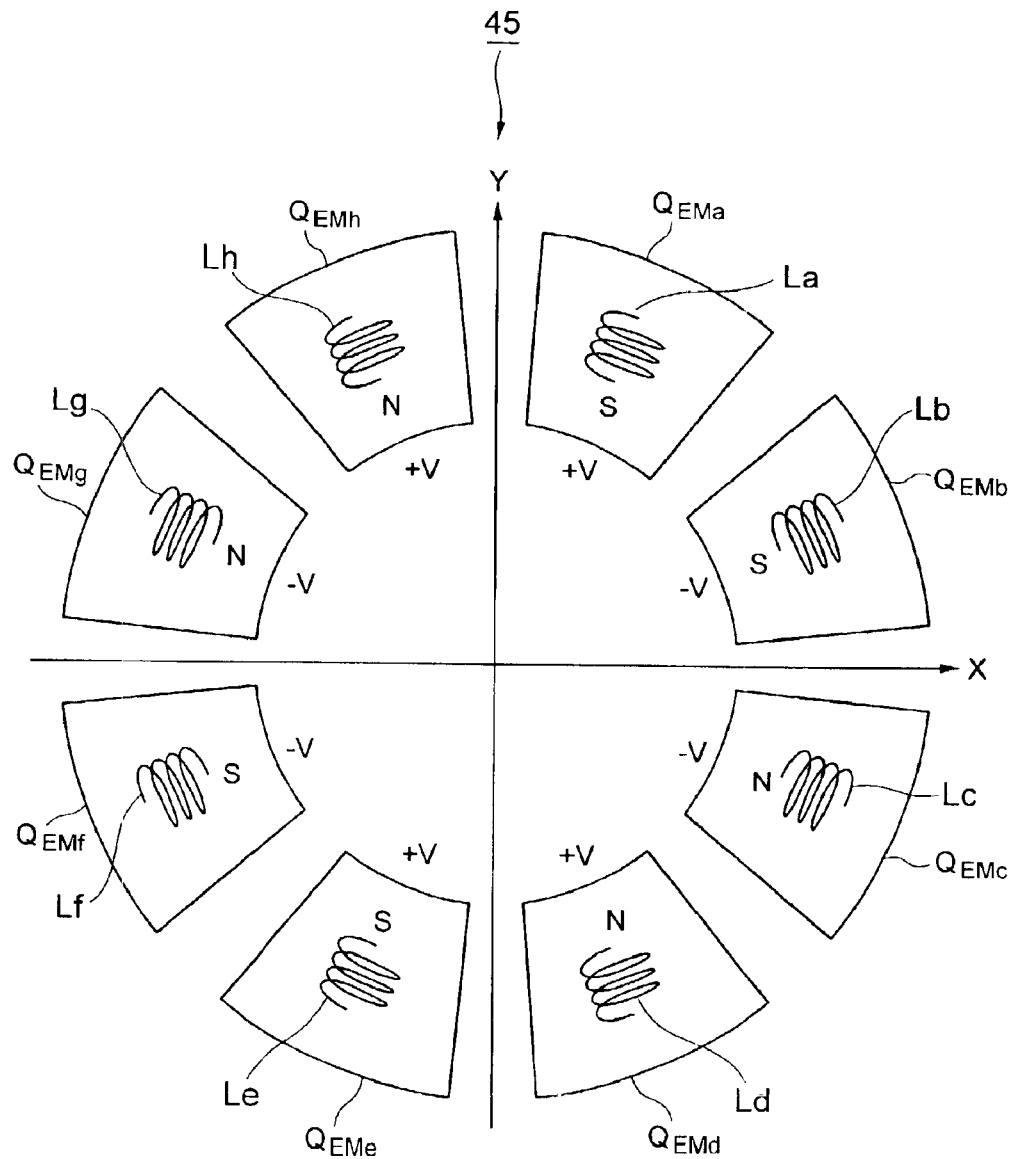
FIG. 17 is a plan view showing an example of a quadruple lens for electric and magnetic fields comprised in the charged particle beam lithography system illustrated in FIG. 16.

FIG. 17 is a plan view showing an example of the quadrupole lens 45. The quadrupole lens 45 shown in FIG. 17 is constructed by metal electrodes $Q_{EMa}$ through $Q_{EMh}$ which eight coils La through Lh are embedded in, respectively, and which are disposed at an angle of 45° with each other so as to form an annulus ring shape. The coils La through Lh and the electrodes $Q_{EMa}$ through $Q_{EMh}$ are formed so as to be electrically insulated from each other. As the material of the electrodes $Q_{EMa}$ through $Q_{EMh}$, iron as a magnetic material, for example, may be used. Alternately, electrodes obtained by metal-plating the surface of ceramic may be used.

According to the third embodiment as described above, since the quadrupole lenses 45a and 45b for electric and magnetic fields are provided, chromatic aberration can be corrected with best efficiency like the second embodiment without further increasing the radius of the electron optical system from the optical axis to the outside.

(4) Fourth Embodiment

A fourth embodiment of the invention will be described with reference to FIGS. 18 to 20.

Figure 18:
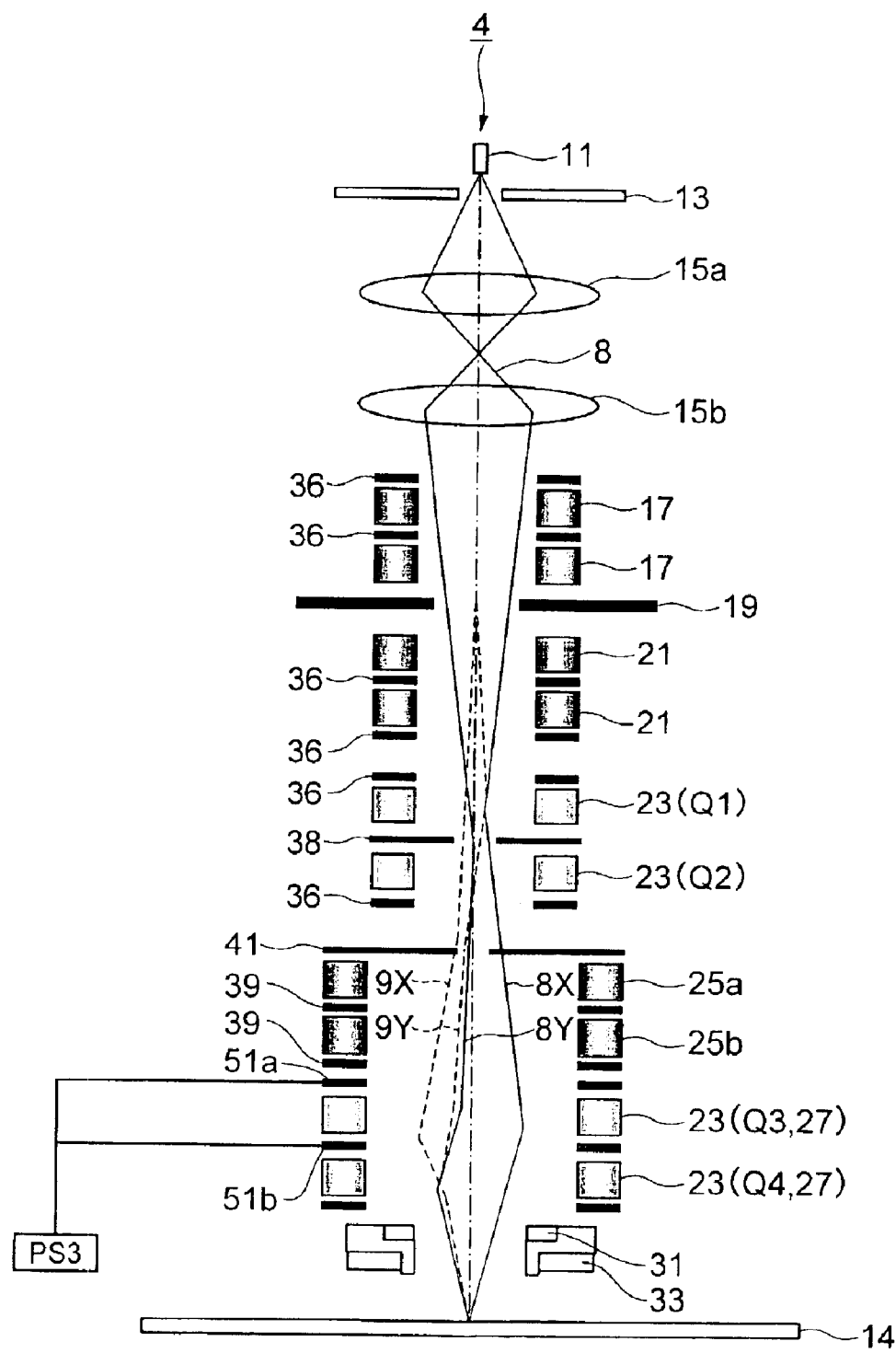
FIG. 18 is a schematic configuration diagram showing a main part of a charged particle beam lithography system according to a fourth embodiment of the invention.

FIG. 18 is a schematic configuration diagram showing a main part of a charged particle beam lithography system according to the fourth embodiment. An electron beam lithography system 4 shown in FIG. 18 is characterized in that it comprises an octapole lens 51a which is provided near the top face of the third multipole lens 23 (Q3) in the Z direction and is connected to a power source PS3 and an octapole lens 51b which is provided between the third and fourth multipole lens 23 (Q3 and Q4) and is similarly connected to the power source PS3. The other configuration of the electron beam lithography system 4 is substantially the same as that of the electron beam lithography system 2 shown in FIG. 13 except for the magnetic field type octapole lenses 43a and 43b. The basic operation of the electron beam lithography system 4 is also substantially the same as that of the electron beam lithography system 2 shown in FIG. 13 except for the chromatic aberration correcting function of the magnetic field type octapole lenses 43. In the following, therefore, the configuration and function of the octapole lenses 51a and 51b will be mainly described.

The octapole lenses 51a and 51b receive application of a variable voltage from the power source P3 and correct spherical aberration which occurs when the aperture angle of the electron beam 8 is increased in entering the demagnification projection optical system.

Figure 19:
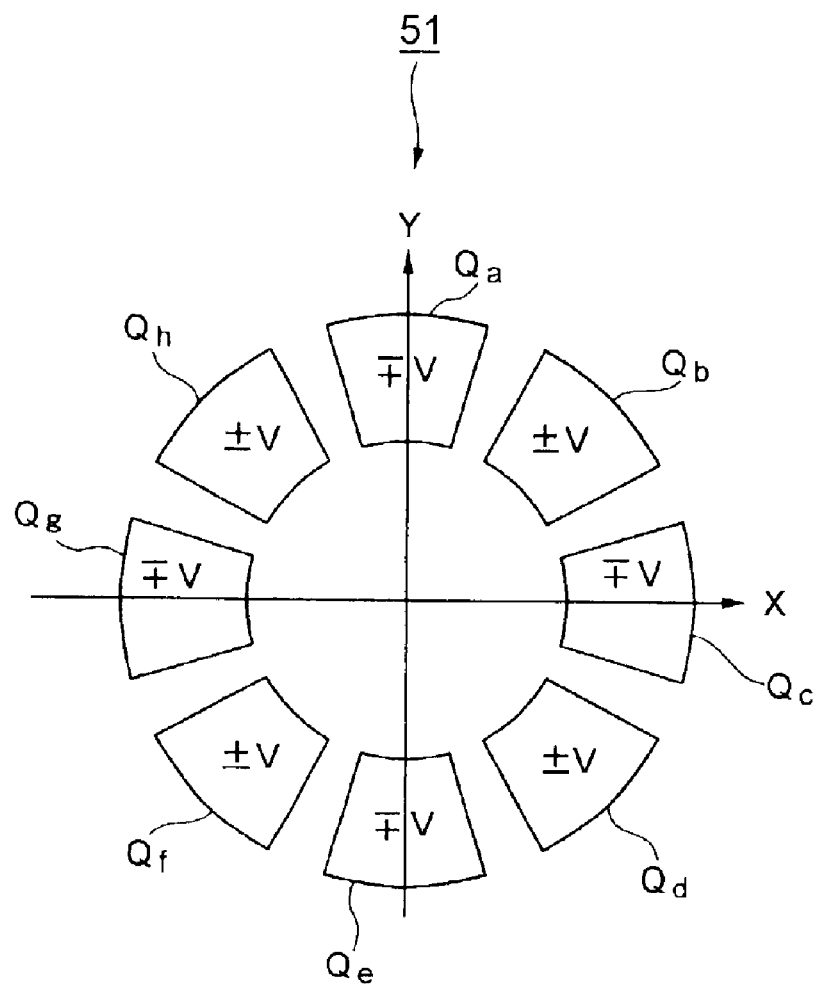
FIG. 19 is a plan view showing an example of an octopole lens comprised in the charged particle beam lithography system illustrated in FIG. 18.

FIG. 19 is a plan view showing an example of the octapole lens 51. The octapole lens 51 shown in FIG. 19 is constructed by eight electrodes Qa through Qh which has a fan shape in plan view and are arranged at an angle of 45° with each other, respectively, so as to form an annulus ring shape. Neighboring ones in the electrodes Qa through Qh receive application of voltages of different polarities from the power source PS3 and excite the octapole fields. This point will be described in detail with reference to the partial enlarged view of FIG. 20.

Figure 20:
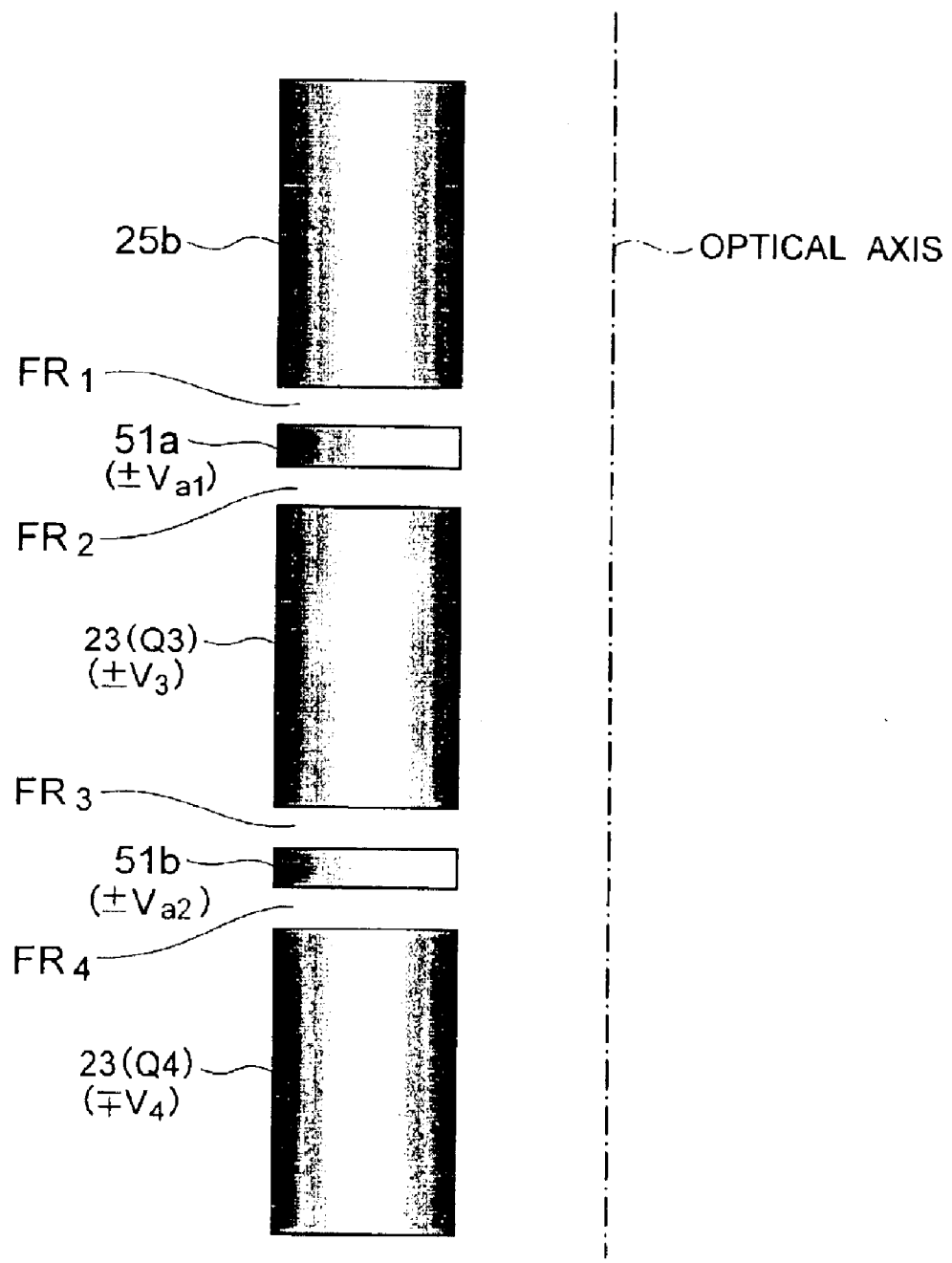
FIG. 20 is a diagram for explaining the operation of the octopole lens shown in FIG. 19.

As shown in FIG. 20, a voltage of ±Va1 is applied to the octapole lens 51a, and a voltage of ±Va2 is applied to the octapole lens 51b. The spherical aberration in the X direction is corrected by octapole fields exited by the octapole lens 51a and the spherical aberration in the Y direction is corrected by the octapole field excited by the octapole lens 51b.

To generate the octapole field, it is not always necessary to dispose the octapole lens. A similar effect can be obtained by disposing an aperture 39 in place of the octapole lens and applying a voltage to the aperture 39 to generate octapole fields in fringes FR2 through FR4 between the aperture 39 and the quadrupole lenses 23.

As described above, according to the fourth embodiment, the spherical aberration can be corrected with a simple configuration, so that the aperture angle of the electron beam 8 entering the demagnification projection optical system from the cell aperture can be increased. Thus, optical aberration and a blur caused by the space-charge effect in an image formation portion on the wafer 14 can be simultaneously reduced.

(5) Fifth Embodiment

A fifth embodiment of the invention will be described with reference to FIG. 21. The feature of the fifth embodiment is that correction of both chromatic aberration and spherical aberration is realized by a single apparatus by combining the chromatic aberration correction according to the third embodiment and the spherical aberration correction according to the fourth embodiment.

Figure 21:
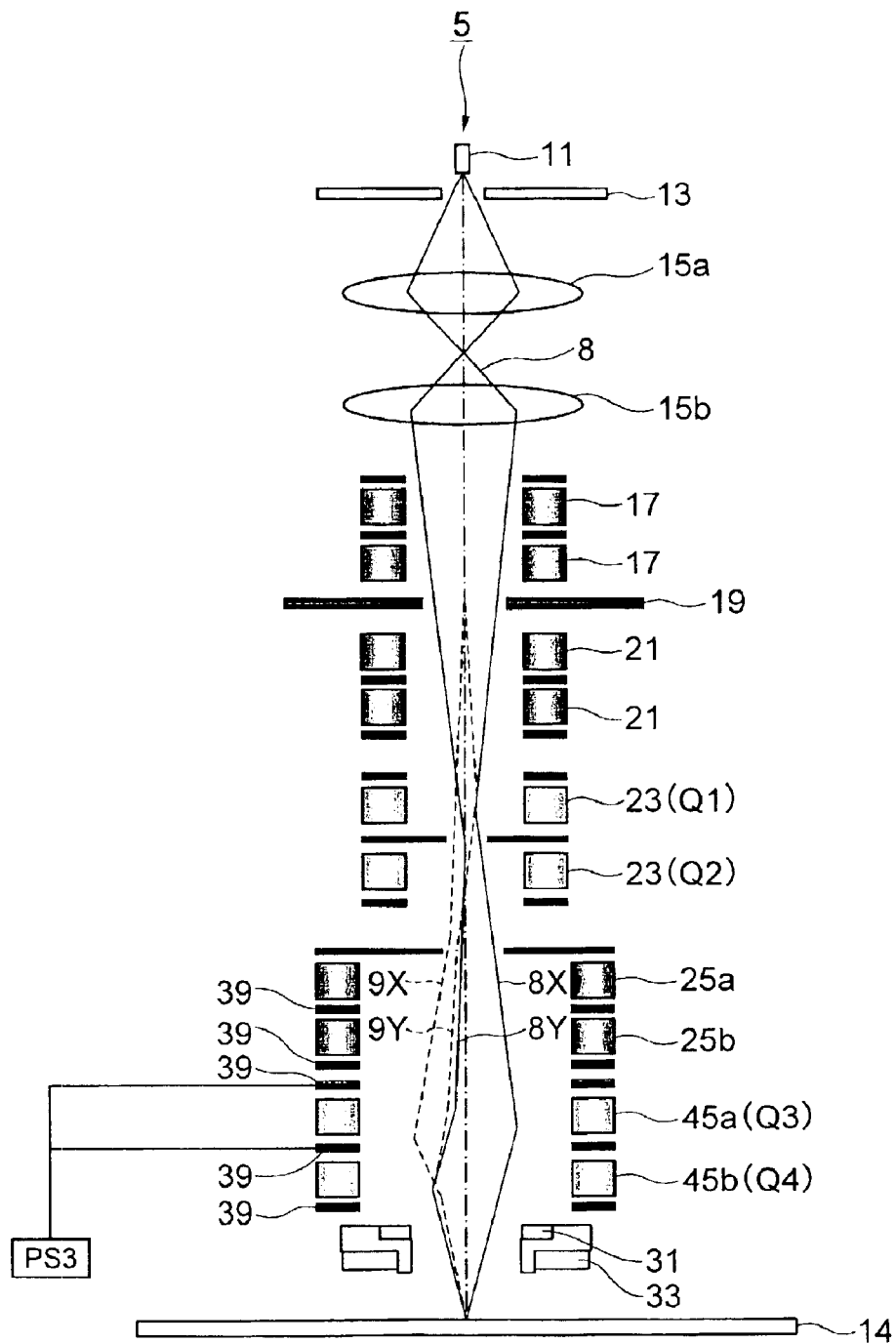
FIG. 21 is a schematic configuration diagram showing a main part of a charged particle beam lithography system according to a fifth embodiment of the invention.

FIG. 21 is a schematic configuration diagram showing a main part of an electron beam lithography system 5 of the fifth embodiment. The electron beam lithography system 5 shown in FIG. 21 is characterized in that it comprises the quadrupole lenses 45a and 45b for electric and magnetic fields and the apertures 39. The apertures 39 are disposed near the top face of the quadrupole lens 45a for electric and magnetic fields in the Z direction and between the quadrupole lenses 45a and 45b for electric and magnetic fields, and are connected to the power source PS3. The apertures 39 disposed near the top face of the quadruple lens 45a for electric and magnetic fields in the Z direction and between quadruple lenses 45a and 45b for electric and magnetic fields receive application of a variable voltage from the power source PS3, operate in a manner similar to the octapole lenses 51a and 51b shown in FIG. 20 and display functions similar to those of the octapole lenses 51a and 51b. Since the basic operation of the electron beam lithography system 5 and the operation and function of the quadrupole lenses 45a and 45b for electric and magnetic fields are substantially the same as those of the second and fourth embodiments, their description will not be repeated.

Thus, according to the present embodiment, both the quadrupole lenses 45a and 45b for electric and magnetic fields for correcting chromatic aberration caused by divergence of the electron beam 8 in the demagnification projection optical system and the aperture 39 for correcting spherical aberration are provided. Consequently, the illumination position LP in the demagnification projection optical system of the electron beam 8 can be set closer to the wafer 14 and the aperture angle of the electron beam 8 can be increased. Since the beam radius of the electron beam can be increased by the above configuration, without deteriorating the optical aberration, a blur caused by the space-charge effect to the image formation on the wafer 14 can be significantly reduced.

(6) Method of Manufacturing Semiconductor Device

According to the embodiments of the invention, the influence of the space-charge effect can be significantly reduced and lithography with reduced aberration can be realized. Consequently, by using such a lithography system or a lithography method, a semiconductor device having a higher packing density can be manufactured with high yield.

By forming a fine pattern on a wafer using the electron beam control method, an accurate pattern having no blur or distortion can be easily formed on the wafer. Since a high-accuracy pattern can be formed on the wafer with a simple configuration, a semiconductor device can be manufactured with higher throughput and yield.

Although the embodiments of the invention have been described above, the invention is not limited to the foregoing embodiments but can be variously modified within the scope and the spirit thereof. In the foregoing first embodiment, an electron beam is deflected in the X direction by using the pre-main deflector 25a, main deflector 23 and sub deflector 31. An electron beam is deflected in the Y direction by using only the main deflector 23 and the sub deflector 31. The deflection is performed while changing the deflection voltage ratio, respectively. The invention, however, is not limited to the embodiment. When a change occurs in the trajectory of the electron beam in the multipole lenses 23 due to a change in the demagnification or a change in the arrangement of the multipole lenses 23, and the like, it is also possible to use different deflectors for deflection in the X direction and deflection in the Y direction and to change a deflection interlocking ratio according to the change of deflectors by, for example, deflecting the electron beam in the X direction using the pre-main deflector 25b, main deflector 23 and sub deflector 31a, and deflecting the electron beam in the Y direction using the pre-main deflector 25a, main deflector 23 and sub deflector 31.

For example, in the foregoing fifth embodiment, the electron beam lithography system and the electron beam control method are described in combination of the third and fourth embodiments. However, it is also possible to employ, for example, combination of the second and fourth embodiments or combination of the second embodiment and the apertures in the fourth embodiment. In the foregoing embodiments is described a manner of correcting at least one of the spherical aberration and chromatic aberration in the X and Y directions independently of each other by using the quadrupole lens. The invention is not limited to such manner. For example, by using an octapole lens (M=8), at least one of spherical aberration and chromatic aberration can be corrected independently of each other in four directions (M/2=4) each of which perpendicularly crosses the optical axis of the electron beam. Furthermore, in the foregoing embodiments, the cases of using an electron beam as a charged particle beam have been described. It is apparent that the invention can be also applied to a lithography system using, for example, an ion beam.

What is claimed is:

1. A charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with an electric field so as to enter a desired cell pattern of the cell aperture, and which deflect the charged particle beam which passes through the cell pattern back to an optical axis thereof;

a demagnification projection optical system which demagnifies the charged particle beam from the cell aperture with an electric field so as to form an image on the wafer;

an illumination position adjusting unit which adjusts an illumination position of the charged particle beam so that the charged particle beam entering said demagnification projection optical system passes through a trajectory substantially symmetrical with respect to the optical axis in one of two planes which intersect at right angle on the optical axis; and a second deflector which deflects the charged particle beam from the cell aperture with an electric field and which scans the wafer with the charged particle beam.

2. The charged particle beam lithography system according to claim 1, wherein said demagnification projection optical system generates a divergent electric field and a convergent electric field in each of a first direction orthogonal to the optical axis and a second direction orthogonal to the first direction and the optical axis in a region closest to the wafer in the optical system, respectively, and one of said two planes is a plane defined by a straight line along said first direction and the optical axis.

3. The charged particle beam lithography system according to claim 1, wherein said demagnification projection optical system includes double multipole lenses arranged between the first deflector and the second deflector, the charged particle beam lithography system further comprises an aperture arranged between the first multipole lens and the second multipole lens, and said illumination position adjusting unit adjusts the illumination position of the charged particle beam by scanning said aperture with the charged particle beam and detecting a change in a current flowing in said aperture during the scan of the charged particle beam.

4. The charged particle beam lithography system according to claim 2, wherein magnification of the charged particle beam in said first direction and magnification of the charged particle beam in said second direction are controlled independently of each other by said demagnification projection optical system so that aberration of the charged particle beam in said first direction and aberration of the charged particle beam in said second direction become substantially the same on the wafer, and the cell aperture is previously formed so that the cell pattern has a shape corresponding to a difference between the magnification of the charged particle beam in said first direction and the magnification of the charged particle beam in said second direction due to control of the demagnification projection optical system.

5. A charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with an electric field so as to enter a desired cell pattern of the cell aperture, and which deflects the charged particle beam which passes through the cell pattern back to an optical axis thereof;

a demagnification projection optical system which demagnifies the charged particle beam from the cell aperture with an electric field so as to form an image on the wafer; and a second deflector which deflects the charged particle beam passed through the cell aperture by an electric field and making the charged particle beam scan the wafer, wherein said demagnification projection optical system controls magnification of the charged particle beam in a first direction orthogonal to the optical axis and magnification of the charged particle beam in a second direction orthogonal to said first direction and the optical axis independently of each direction so that aberration of the charged particle beam in said first direction and aberration of the charged particle beam in said second direction become substantially the same on the wafer, and the cell aperture is previously formed so that the cell pattern has a shape corresponding to a difference between the magnification of the charged particle beam in said first direction and the magnification of the charged particle beam in said second direction due to control of said demagnification projection optical system.

6. A charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperture having a cell pattern of a shape corresponding to a desired pattern to be written;

a first deflector which deflects the charged particle beam with a first electric field so as to enter a desired cell pattern of the cell aperture, and which deflects the charged particle beam which passes through said cell pattern back to an optical axis thereof;

a demagnification projection optical system which demagnifies the charged particle beam from the cell aperture with a second electric field so as to form an image on the wafer; and a second deflector which deflects the charged particle beam from the cell aperture with a third electric field to adjust an irradiation position of the charged particle beam on the wafer, wherein said demagnification projection optical system includes N-fold (N: a natural number of 2 or larger) of M-pole lenses (M: an even number of 4 or larger) and an aberration corrector which corrects at least one of spherical aberration and chromatic aberration in "M/2" directions each orthogonal to the optical axis independently of each other, each of the spherical aberration and chromatic aberration occurring when the beam radius is adjusted to increase by said illumination optical system in order to reduce a blur caused by a space-charge effect in a position where the charged particle beam forms an image on the wafer.

7. The charged particle beam lithography system according to claim 6, wherein said M-pole lens is a quadrupole lens, and said "M/2" directions are a first direction and a second direction which are orthogonal to each other.

8. The charged particle beam lithography system according to claim 7, wherein said aberration corrector includes a first chromatic aberration corrector which corrects chromatic aberration in said first direction by exciting a quadrupole magnetic field and which superimposes the quadrupole magnetic field on an electric field generated by the (N−1) the quadrupole lens of the quadrupole lenses counting from the cell aperture side.

9. The charged particle beam lithography system according to claim 8, wherein said first chromatic aberration corrector has a quadrupole lens of a magnetic field type provided outside of said (N−1)th quadrupole lens and substantially on a level with said (N−1)th quadrupole lens in a direction along the optical axis.

10. The charged particle beam lithography system according to claim 7, wherein said aberration corrector includes a second chromatic aberration corrector which corrects chromatic aberration in said second direction by exciting a quadrupole magnetic field and which superimposes the quadrupole magnetic field on an electric field generated by the Nth quadrupole lens of the quadrupole lenses counting from the cell aperture side.

11. The charged particle beam lithography system according to claim 10, wherein said second chromatic aberration corrector has a quadrupole lens of a magnetic field type provided outside of said Nth quadrupole lens and at a substantially same level as that of said Nth quadrupole lens in a direction along the optical axis.

12. The charged particle beam lithography system according to claim 7, wherein at least one of the Nth and the (N−1)th quadrupole lens of the quadrupole lenses counting from the cell aperture side, respectively, is a quadrupole lens for electric and magnetic fields having a coil and an electrode so as to cover the coil and electrically insulated from the coil to construct at least a part of a first chromatic aberration corrector and a second chromatic aberration corrector, said first chromatic aberration corrector correcting chromatic aberration in said first direction by generating a first electric field of said (N−1)th quadrupole lens, by exciting a first magnetic field and by superimposing the magnetic field on said electric field of said (N−1)th quadrupole lens, and, said second chromatic aberration corrector correcting chromatic aberration in said second direction by generating a second electric field of said Nth quadrupole lens, by exciting a second magnetic field and by superimposing the magnetic field on the electric field of said Nth quadrupole lens.

13. The charged particle beam lithography system according to claim 6, wherein said aberration corrector includes a first spherical aberration corrector which corrects spherical aberration in at least one of said "M/2" directions by generating a fourth electric field on the cell aperture side of said (N−1)th M-pole lens counting from the cell aperture side.

14. The charged particle beam lithography system according to claim 13, wherein said first spherical aberration corrector further comprises a 2M-pole lens arranged at least one of a top face side and an under face side of said (N−1)th M-pole lens in a direction along the optical axis.

15. The charged particle beam lithography system according to claim 6, wherein said aberration corrector includes a second spherical aberration corrector which corrects spherical aberration in at least one of said "M/2" directions by generating a fifth electric field on the wafer side of said (N−1)th M-pole lens counting from the cell aperture side.

16. The charged particle beam lithography system according to claim 15, wherein said second spherical aberration corrector has an aperture which is arranged at least one of a top face side and an under face side of said (N−1)th M-pole lens in a direction along the optical axis.

17. A lithography method using a charged particle beam comprising:
generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;
adjusting a beam radius of the charged particle beam;
a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;
demagnifying the charged particle beam from the cell aperture with an electric field so as to form an image on the wafer;
adjusting an illumination position of the charged particle beam so that the charged particle beam from the cell pattern passes through a trajectory which is substantially symmetrical with respect to the optical axis in one of two planes intersecting at a right angle on the optical axis; and
a second deflection to deflect the charged particle beam of which illumination position is adjusted with an electric field to scan the wafer with the charged particle beam.

18. The lithography method according to claim 17, wherein said demagnification of the charged particle beam includes a final demagnification to generate a divergent electric field and a convergent electric field in a first direction orthogonal to the optical axis and in a second direction orthogonal to said first direction and the optical axis in a region close to the wafer, respectively, and
the illumination position of the charged particle beam is controlled so that the charged particle beam from the cell pattern passes through a trajectory which is substantially symmetrical with respect to the optical axis in a plane defined by a straight line along said first direction and the optical axis.

19. The lithography method according to claim 18, wherein said demagnifying the charged particle beam includes controlling magnification of the charged particle beam in said first direction and magnification of the charged particle beam in said second direction independently of each other so that aberration of the charged particle beam in said first direction and aberration of the charged particle beam, in said second direction become substantially the same on the wafer.

20. The lithography method according to claim 19, wherein said demagnification of the charged particle beam includes a final demagnification to generate a divergent electric field and a convergent electric field in said first direction and in said second direction in a region close to the wafer, respectively,
and magnification of the charged particle beam in said first direction is larger than magnification of the charged particle beam in said second direction.

21. The lithography method according to claim 17, wherein said second deflection includes controlling a deflection width of the charged particle beam in a first direction orthogonal to the optical axis and a deflection width of the charged particle beam in a second direction orthogonal to said first direction and the optical axis independently of each other so that deflection aberration of the charged particle beam in said first direction and deflection aberration of the charged particle beam in said second direction become substantially the same in a region close to the wafer.

22. The lithography method according to claim 21, wherein said demagnification of the charged particle beam includes a final demagnification to generate a divergent electric field and a convergent electric field in said first direction and in said second direction in a region close to the wafer, respectively, and a deflection width of the charged particle beam in said first direction is smaller than a deflection width of the charged particle beam in said second direction.

23. A lithography method using a charged particle beam comprising:

generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture by an electric field so as to form an image on the wafer; and a second deflection to deflect the charged particle beam from the cell aperture with an electric field and to scan the wafer with the charged particle beam, wherein said second deflection includes controlling a deflection width of the charged particle beam in a first direction which is orthogonal to the optical axis and a deflection width of the charged particle beam in a second direction which is orthogonal to said first direction and the optical axis independently of each other so that a deflection aberration of the charged particle beam in said first direction and a deflection aberration of the charged particle beam in said second direction become substantially the same on the wafer.

24. The lithography method according to claim 23, wherein said demagnifying step includes a final demagnifying step of generating a divergent electric field and a convergent electric field in each of said first direction and said second direction in a region close to the wafer, and deflection width of the charged particle beam in said first direction is smaller than deflection width of the charged particle beam in said second direction.

25. The lithography method according to claim 23, wherein said demagnifying the charged particle beam includes controlling magnification of the charged particle beam in said first direction and magnification of the charged particle beam in said second direction independently of each other so that aberration of the charged particle beam in said first direction and aberration of the charged particle beam in said second direction become substantially the same on the wafer.

26. The lithography method according to claim 25, wherein said demagnification of the charged particle beam includes a final demagnification to generate a divergent electric field and a convergent electric field in said first direction and in said second direction in a region close to the wafer, respectively, and magnification of the charged particle beam in said first direction is larger than magnification of the charged particle beam in said second direction.

27. A lithography method using a charged particle beam, comprising:

generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer; and a second deflection to deflect the charged particle beam from the cell aperture with an electric field and to scan the wafer with the charged particle beam, wherein said demagnifying the charged particle beam includes controlling magnification of the charged particle beam in a first direction orthogonal to the optical axis and magnification of the charged particle beam in a second direction orthogonal to said first direction and the optical axis independently of each other so that an aberration of the charged particle beam in said first direction and an aberration of the charged particle beam in said second direction become substantially the same on the wafer.

28. The lithography method according to claim 27, wherein said demagnification of the charged particle beam includes a final demagnification to generate a divergent electric field and a convergent electric field in said first direction and in said second direction in a region close to the wafer, respectively, and magnification of the charged particle beam in said first direction is larger than magnification of the charged particle beam in said second direction.

29. A charged particle beam controlling method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;
demagnifying the charged particle beam from the cell aperture with a second electric field so as to form an image on the wafer; and
a second deflection to deflect the charged particle beam from the cell aperture with a third electric field and to adjust the irradiation position on the wafer,
wherein said second electric field includes N-folds (N: a natural number of 2 or larger) of M-pole (M: an even number of 4 or larger) electric fields generated by an M-pole lens, respectively, and
said demagnification of the charged particle beam includes an aberration correction to correct at least one of a spherical aberration and a chromatic aberration in "M/2" directions each orthogonal to the optical axis independently of each other, each of the spherical aberration and the chromatic aberration occurring when said beam radius is adjusted to increase in said beam radius adjustment in order to reduce a blur caused by a space-charge effect in a position where the charged particle beam forms an image on the wafer.

30. The charged particle beam controlling method according to claim 29, wherein said M-pole lens is a quadrupole lens which generates quadrupole electric fields, and said "M/2" directions are a first direction and a second direction which are orthogonal to each other.

31. The charged particle beam controlling method according to claim 30, wherein said aberration correction includes correcting chromatic aberration in said first direction by exciting a first quadrupole magnetic field to be superimposed on an electric field generated by the (N−1)th quadrupole lens of the N-fold quadrupole lenses counting from the cell aperture side.

32. The charged particle beam controlling method according to claim 30, wherein said aberration correction includes correcting chromatic aberration in said second direction by exciting a second quadrupole magnetic field to be superimposed on an electric field generated by the Nth quadrupole lens of the N-fold quadrupole lenses counting from the cell aperture side.

33. The charged particle beam controlling method according to claim 30, wherein said aberration correcting step includes a step of correcting spherical aberration in said first direction by generating a fourth electric field in a region on the cell aperture side of the (N−1)th lens from the cell aperture side in said quadrupole lens.

34. The charged particle beam controlling method according to claim 30, wherein said aberration correction includes correcting spherical aberration in said second direction by generating a fifth electric field in a region on the wafer side of the (N−1)th quadrupole lens counting from the cell aperture side.

35. A method of manufacturing a semiconductor device using a lithography method employing a charged particle beam, said lithography method comprising:
generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;
adjusting a beam radius of the charged particle beam;
a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;
demagnifying the charged particle beam from the cell aperture with an electric field so as to form an image on the wafer;
adjusting an illumination position of the charged particle beam so that the charged particle beam from the cell pattern passes through a trajectory which is substantially symmetrical with respect to the optical axis in one of two planes intersecting at a right angle on the optical axis; and
a second deflection to deflect the charged particle beam of which illumination position is adjusted with an electric field to scan the wafer with the charged particle beam.

36. A method of manufacturing a semiconductor device using a lithography method employing a charged particle beam, said lithography method comprising:
generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;
adjusting a beam radius of the charged particle beam;
a first deflection to deflect the charged particle beam with an electric field so as to enter a desired cell pattern of a cell aperture having a cell pattern of a shape corresponding to a desired pattern to be written and to deflect the charged particle beam which passes through the cell pattern back to an optical axis thereof;
demagnifying the charged particle beam from the cell aperture by an electric field so as to form an image on the wafer; and
a second deflection to deflect the charged particle beam from the cell aperture with an electric field and to scan the wafer with the charged particle beam,
wherein said second deflection includes controlling a deflection width of the charged particle beam in a first direction which is orthogonal to the optical axis and a deflection width of the charged particle beam in a second direction which is orthogonal to said first direction and the optical axis independently of each other so that deflection aberration of the charged particle beam in said first direction and deflection aberration of the charged particle beam in said second direction become substantially the same on the wafer.

37. A method of manufacturing a semiconductor device using a lithography method employing a charged particle beam, said lithography method comprising:
generating the charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;
adjusting a beam radius of the charged particle beam;
a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with an electric field so as to form an image on the wafer; and a second deflection to deflect the charged particle beam from the cell aperture with an electric field and to scan the wafer with the charged particle beam, wherein said demagnifying the charged particle beam includes controlling magnification of the charged particle beam in a first direction orthogonal to the optical axis and magnification of the charged particle beam in a second direction orthogonal to said first direction and the optical axis independently of each other so that an aberration of the charged particle beam in said first direction and an aberration of the charged particle beam in said second direction become substantially the same on the wafer.

38. A method of manufacturing a semiconductor device using a lithography method employing a charged particle beam, said lithography method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with a second electric field so as to form an image on the wafer; and a second deflection to deflect the charged particle beam from the cell aperture with a third electric field and to adjust the irradiation position on the wafer, wherein said second electric field includes N-folds (N: a natural number of 2 or larger) of M-pole CM: an even number of 4 or larger) electric fields generated by an M-pole lens, respectively, and said demagnification of the charged particle beam includes an aberration correction to correct at least one of spherical aberration and chromatic aberration in "M/2" directions each orthogonal to the optical axis independently of each other, each of the spherical aberration and chromatic aberration occurring when said beam radius is adjusted to increase in said beam radius adjustment in order to reduce a blur caused by a space-charge effect in a position where the charged particle beam forms an image on the wafer.

39. A charged particle beam lithography system comprising:

a charged particle beam emitter which generates a charged particle beam and which emits the charged particle beam to a wafer, the charged particle beam emitter emitting the charged particle beam at an acceleration voltage lower than a voltage causing a proximity effect that back scattered electrons generated from the wafer by irradiation of the charged particle beam influence an exposure amount of a pattern to be written close to an irradiation position of the charged particle beam;

an illumination optical system which adjusts a beam radius of the charged particle beam;

a cell aperature having a cell pattern of a shape corresponding to a desired pattern to be written;

a first deflector which deflects the charged particle beam with a first electric field so as to enter a desired cell pattern of the cell aperture, and which deflects the charged particle beam which passes through said cell pattern back to an optical axis thereof;

a demagnification projection optical system which demagnifies the charged particle beam from the cell aperture with a second electric field so as to form an image on the wafer; and a second deflector which deflects the charged particle beam from the cell aperture with a third electric field to adjust an irradiation position of the charged particle beam on the wafer, wherein said demagnification projection optical system includes N-fold (N: a natural number of 2 or larger) of M-pole lenses (M: an even number of 4 or larger) and an aberration corrector which corrects both of spherical aberration and chromatic aberration in "M/2" directions each orthogonal to the optical axis, independently of each other, the aberration occurring when the beam radius is increased by said irradiation optical system in order to reduce a blur caused by a space-charge effect in a position where the charged particle beam forms an image on the wafer.

40. A charged particle beam controlling method comprising:

generating a charged particle beam and emitting the charged particle beam to a wafer, the charged particle beam being generated at an acceleration voltage lower than a voltage causing a proximity effect that back scattered electrons generated from the wafer by irradiation of the charged particle beam influence an exposure amount of a pattern to be written close to an irradiation position of the charged particle beam on the wafer;

adjusting a beam radius of the charged particle beam;

a first deflection to deflect the charged particle beam with a first electric field so as to enter a desired cell pattern of a cell aperture having a cell pattern of a shape corresponding to a desired pattern to be written and to deflect the charged particle beam which passes through the cell pattern back to an optical axis thereof;

demagnifying the charged particle beam from the cell aperture with a second electric field so as to form an image on the wafer; and a second deflection to deflect the charged particle beam from the cell aperture with a third electric field and to adjust the irradiation position on the wafer, wherein said second electric field includes N-folds (N: a natural number of 2 or larger) of M-pole (M: an even number of 4 or larger) electric fields generated by an M-pole lens, respectively, and said demagnification of the charged particle beam includes an aberration correction to correct both of a spherical aberration and a chromatic aberration in "M/2" directions each orthogonal to the optical axis, independently of each other, the aberration occurring when said beam radius is increased in said beam radius adjustment in order to reduce a blur caused by a space-charge effect in a position where the charged particle beam forms an image on the wafer.

* * * * *

UNITED STATES PATENT AND TRADEMARK OFFICE
CERTIFICATE OF CORRECTION

PATENT NO. : 6,940,080 B2
DATED : September 6, 2005
INVENTOR(S) : Nagano et al.

It is certified that error appears in the above-identified patent and that said Letters Patent is hereby corrected as shown below:

Title page,
Item [57], ABSTRACT,
Line 5, change "charged beam;" to -- charged particle beam; --.
Line 11, change "beam form the" to -- beam from the --.

Column 23,
Line 8, change "(N-1) the" to -- (N-1)th --.

Column 24,
Line 56, change "beam, in" to -- beam in --.

Column 27,
Line 29, change "correcting chromatic" to -- correcting the chromatic --.

Column 29,
Line 45, change "CM:" to -- (M: --.

Signed and Sealed this

Thirteenth Day of December, 2005

JON W. DUDAS
*Director of the United States Patent and Trademark Office*